US009286432B1

(12) United States Patent
Gerousis et al.

(10) Patent No.: US 9,286,432 B1
(45) Date of Patent: Mar. 15, 2016

(54) METHODS, SYSTEMS, AND ARTICLES OF MANUFACTURE FOR IMPLEMENTING CORRECT-BY-CONSTRUCTION PHYSICAL DESIGNS WITH MULTIPLE-PATTERNING-AWARENESS

(71) Applicant: Cadence Design Systems, Inc., San Jose, CA (US)

(72) Inventors: Vassilios Gerousis, San Jose, CA (US); Shuo Zhang, Fremont, CA (US); Stefanus Mantik, San Jose, CA (US); Yuan Huang, Redwood City, CA (US); Jing Chen, Fremont, CA (US); Jianmin Li, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/840,717

(22) Filed: Mar. 15, 2013

(51) Int. Cl.
 *G06F 17/50* (2006.01)
(52) U.S. Cl.
 CPC .................. *G06F 17/5077* (2013.01)
(58) Field of Classification Search
 CPC .................. G06F 17/30; G06F 17/50
 USPC .......................................................... 716/131
 See application file for complete search history.

(56) References Cited

U.S. PATENT DOCUMENTS

| 5,757,089 | A * | 5/1998 | Ishizuka ........................ 307/147 |
| 5,808,899 | A | 9/1998 | Scepanovic et al. |
| 5,837,557 | A | 11/1998 | Fulford et al. |
| 6,292,929 | B2 | 9/2001 | Scepanovic et al. |
| 7,197,738 | B1 * | 3/2007 | Hetzel et al. .................... 716/126 |
| 7,280,945 | B1 * | 10/2007 | Weiner et al. ....................... 703/2 |
| 7,424,695 | B2 * | 9/2008 | Tamura et al. ................. 716/130 |
| 7,691,549 | B1 | 4/2010 | Glasser |
| 7,721,243 | B2 | 5/2010 | Hetzel et al. |
| 8,341,586 | B2 * | 12/2012 | Frankle et al. ................. 716/126 |
| 2001/0003843 | A1 | 6/2001 | Scepanovic et al. |
| 2003/0121018 | A1 * | 6/2003 | Leung et al. ...................... 716/12 |
| 2004/0143797 | A1 * | 7/2004 | Nguyen et al. ..................... 716/1 |
| 2009/0204930 | A1 * | 8/2009 | Cohn et al. ......................... 716/4 |
| 2009/0254875 | A1 * | 10/2009 | Mehrotra et al. ................ 716/12 |
| 2010/0187658 | A1 | 7/2010 | Wei |
| 2012/0131528 | A1 * | 5/2012 | Chen et al. ...................... 716/112 |
| 2013/0168827 | A1 * | 7/2013 | Kodama et al. ................ 257/618 |
| 2013/0346937 | A1 * | 12/2013 | Kennedy et al. .............. 716/122 |

(Continued)

OTHER PUBLICATIONS

Non-Final Office Action dated Feb. 28, 2014 for U.S. Appl. No. 13/840,567.

(Continued)

*Primary Examiner* — Mohammed Alam
(74) *Attorney, Agent, or Firm* — Vista IP Law Group, LLP

(57) ABSTRACT

Disclosed are methods, systems, and articles of manufactures for implementing correct-by-construction physical designs with multiple-patterning-awareness by identifying a first set of grids for a layer based at least in part upon characteristics of other layer(s), identifying a set of tracks for the layer to implement the physical design for the layer, and implementing a shape in the physical design by at least terminating an end of the shape at a grid of the identified first set of grids. The end of the shape may be extended or contracted from its as-design location to the grid. The physical design thus implemented is correct-by-construction and is free of violations of one or more directional design rules.

31 Claims, 22 Drawing Sheets

(56) References Cited

U.S. PATENT DOCUMENTS

2014/0038085 A1* 2/2014 Chern et al. .................. 430/5
2014/0115546 A1* 4/2014 Wang et al. .................. 716/55

OTHER PUBLICATIONS

Notice of Allowance dated May 30, 2014 for U.S. Appl. No. 13/840,259.

Ex-Parte Quayle Action dated Mar. 12, 2014 for U.S. Appl. No. 13/840,259.

Notice of Allowance dated Feb. 27, 2015 for U.S. Appl. No. 13/840,567.

Non-Final Office Action dated Nov. 12, 2014 for U.S. Appl. No. 13/840,567.

Saxena, Prashant, Rupesh S. Shelar, and Sachin Sapatnekar. Routing Congestion in VLSI Circuits: Estimation and Optimization. Springer Science & Business Media, 2007.

* cited by examiner

METHODS, SYSTEMS, AND ARTICLES OF MANUFACTURE FOR IMPLEMENTING CORRECT-BY-CONSTRUCTION PHYSICAL DESIGNS WITH MULTIPLE-PATTERNING-AWARENESS

CROSS REFERENCE TO RELATED APPLICATION(S)

This application is related to U.S. patent application Ser. No. 13/840,259 entitled "METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN" and filed under U.S. patent application Ser. No. 13/840,567, entitled "METHODS, SYSTEMS, AND ARTICLES OF MANUFACTURE FOR PERFORMING DESIGN RULE CHECK FOR ELECTRONIC DESIGNS" the content of both applications is hereby incorporated by reference in its entirety for all purposes.

In some embodiments, the method illustrated in FIG. 2 may comprise the process 204 of identifying or determining a first set of multiple-exposure (MP) grids for the first layer. In some embodiments, the first set of grids is used for multiple patterning or multiple exposure lithography processes, such as a self-aligned double patterning lithography process. More details about identifying or determining a set of MP grids are described in FIGS. 4, 4A-B, and 6A-C and their respective description as well as U.S. application Ser. No. 13/840,259, entitled "METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN" the content of which is hereby incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Multiple-patterning techniques, such as the sidewall image transfer techniques with two masks per metal layer, have been used to manufacture deep-submicron electronic designs. In typical multiple-patterning approaches, each metal layer is fabricated with multiple photolithographic masks. Using multiple core masks often give rise to systematic or non-systematic alignment or overlay issues between the multiple core masks. The recent development of the self-aligned double patterning (SADP) avoids such alignment or overlay issues by using a core mask and a trim mask (or block mask) for each layer to be printed on a lithographic system. Nonetheless, with the advent of 32 nanometer (32 nm) technology and beyond (e.g., 22 nm, 14 nm, 10 nm, etc.), the trim mask require its own design rules that are often merged with metal layout design rules. Moreover, the trim mask rules are often global in nature and thus pose significant difficulties in physical design implementation tools. For example, a typical line staggering rule may cover as many adjacent lines as possible, and thus modifying one line to obey this line staggering rule may affect the next line(s) or even lines that are distant from the line that is being modified. In addition, the trim mask rules are often directional in nature and depend upon how a mask feature is disposed on the trim mask relative to another mask feature.

In addition, traditional design rule checking is based on geometries or geometric shapes in a physical design of an electronic circuit. Nonetheless, as described earlier, the trim mask rules and requirements are often merged with the layout design rules yet are oftentimes global and directional in nature. Although nothing prevents the application of a traditional design rule checking to an electronic circuit design with 32 nm or beyond technology nodes, the search time and hence the amount of time required for traditional DRC is proportional to log (n) even if the search is done locally (e.g., within a confined region of a layout), where n denotes the number of shapes in the entire layout. Such a traditional DRC approach often requires several hours or even days to complete its execution, especially for a modern electronic circuit design having hundreds of millions or even billions of transistors.

Gridded physical implementation of electronic design has been widely used. Nonetheless, the traditional gridded physical implementation is not correct-by-construction and fails to accommodate the trim mask rules. In addition, conventional physical design approaches are usually dependent upon the total number of shapes in a physical design. In other words, the larger the electronic design is, the longer it takes these conventional physical design tools to perform their respective functions. Regarding multiple-patterning to achieve half-pitch sizes in modern electronics (e.g., designs with 14 nm or 10 nm technology nodes), some previous solutions utilize multiple core masks; and some other previous solutions utilize self-aligned double patterning techniques. Both approaches have their own respective disadvantages and do not accommodate the trim mask rules. For design rule checking, conventional DRC examines the shapes or geometries of a physical design, and the search time for each search of the conventional DRC is proportional to log(n), where n denotes the total number of shapes in the entire design. Another advantage of various embodiments is that the layout may be further simplified to, for example, an edge map or a grid map, that includes only the location data for the shape ends of shapes (e.g., interconnects, pins, pads, terminals, etc.), instead of the full geometry layout data. Such a simplified layout may greatly expedite the efficiency of post-physical design processing tools (e.g., a DRC tool).

Therefore, there is a need for implementing the multiple-patterning aware correct-by-construction routing solutions for an electronic design. More specifically, several embodiments of the invention accommodate such trim mask rules and enable the routing process to find legal paths with no design rule checking while transforming the global problem resulting from the global nature of the trim mask rules into a local problem for the routing process to identify legal paths for semiconductor technologies beyond the 32 nm technology. There is also a need for a new design rule check process and a new violation fixing process for electronic designs having advanced technology nodes such as the 10-nm nodes in modern electronics.

SUMMARY

Disclosed are methods, systems, and articles of manufactures for implementing multiple-patterning-aware correct-by-construction layout processing for an electronic design.

Various embodiments define or identify one or more sets of grids for a metal layer and then uses a routing engine (e.g., a flexible coloring routing engine) to determine a routing solution for an interconnect. Some embodiments instruct the routing engine to extend the end of the interconnect to an appropriate grid line in the one or more sets of grids. The one or more sets of grids may be deemed as some routing tracks that are not to be used to route interconnects on the layer on which an interconnect is extended in some embodiments where only the right-way tracks are used for each routing layer. Rather, these tracks may be the routing tracks for an adjacent layer of the current layer on which interconnects are extended to the corresponding grids. For example, one or more sets of vertical routing grids may be defined or identified on a horizontal routing layer under consideration in some embodiments where a routing layer allows for only the right-way tracks. An interconnect may thus be represented and stored at a higher abstraction level in some embodiments. For example, an interconnect may be represented by the "high-end", the "low-end", and the "through-wire" attributes in a design database, rather than storing the shapes, length, etc. as is usually done with traditional design database. Some embodiments also apply similar processes to determine the routing solutions and allows for both the right-way and the wrong-way tracks on the same routing layer by using, for example, extra bit(s) in representing an interconnect in a data structure that is used to store the routing solution at a higher abstraction level. For example, the design data structure for the interconnect may be augmented by incorporating extra bits to store the "high-wire" and/or the "low-wire" to accommodate the wrong way tracks of the interconnect.

The one or more sets of grids may include a single set of grids that may be termed "the set of high end grids" or "higher grids" in some embodiments. Some embodiments may have more than one set of grids. For example, some embodiments may employ both the set of high end grids as well as the set of low end grids (or "lower grids") on a single routing layer. It shall be noted that the one or more sets of grids are not randomly determined or by simply aligning to the manufacturing grids or some uniformly spaced routing tracks. Rather, one set of grids (e.g., the set of lower end grids) may be determined based at least in part upon one or more design rules such as but not limited to a cut enclosure rule for a via in some embodiments. In some embodiments, the one or more sets of grids may also be determined based at least on, for example but not limited to, the design rule controlling the routing pitch size. It shall be noted that a multiple (e.g., an integral multiple) of the grid pitch of a set of grids may be identical to the routing pitch in some embodiments. The finer the grid pitch is, the better resolution there will be, and the less space will be consumed by extending an interconnect to a grid line at the cost of increasing sizes of the data structure(s) to store the design information. Some embodiments may also determine at least some of the one or more sets of grids based at least in part upon an offset between two adjacent routing layers. Some embodiments determine the one or more sets of grids for a routing layer based at least in part upon both the pitch and the offset. In some embodiments, the one or more sets of grids for the routing engine may be the same as the one or more sets of grids for design rule checking engine. In some other embodiments, the one or more sets of grids for the routing engine may be different from the one or more sets of grids for design rule checking engine. For the routing engine, finer grids provide better resolution and finer adjustments for the routing engine to adjust certain interconnects, although at the expense of possibly larger data structure for storing the design information. For the design rule checking engine, finer grids may possibly (although not necessarily) lead to larger data structure for the design information and thus may lead to more expensive design rule checking process.

After the one or more sets of grids are determined or identified, the routing engine (e.g., a routing engine with the flexible coloring methodology) may then route the features for a core mask and the trim mask and extend the line ends of wires to the appropriate, corresponding grids when these line ends do not fall on any of the one or more sets of grids. The appropriate grids will be determined based at least in part on how many sets of grids are used for routing. In some embodiments where only one set of grids is used, the routing engine may extend the line ends to the corresponding grids (e.g., the nearest grids). In some other embodiments where two sets of grids (e.g., high-end grids and low-end grids) are used, the routing engine may extend line ends on one end of the lines to the first set of grids and the line ends on the other end of the lines to the second set of grids. Because of the use of the flexible coloring methodology in some embodiments, the routing solution thus determined complies with the coloring requirements. Moreover, the routing engine with the specially defined grids enable the system to find the routing solution that not only accommodates the layout design rules but also complies with the separate trim mask rules.

In some embodiments where the routing engine extends (or contracts) a line end of an interconnect to an appropriate grid in the one or more sets of grids, extending (or contracting) the line end may push (or pull) other circuit feature(s) further away (or closer to) the extended (or contracted) line end of the interconnect that is being manipulated. In some embodiments, the process of extending (or contracting) a line end of an interconnect may also reserve a space with a predetermined size, and the reserved space may further push (or pull) other circuit feature(s) further away (or closer to) the extended (or contracted) line end of the interconnect that is being manipulated. In addition or in the alternative, extending a line end of an interconnect may result in a short between the interconnect and another circuit feature(s). Some embodiments can also detect such a short. Some embodiments utilize the flexible coloring routing engine for routing interconnects.

BRIEF DESCRIPTION OF THE FIGURES

The drawings illustrate the design and utility of various embodiments. It should be noted that the figures are not drawn to scale and that elements of similar structures or functions are represented by like reference numerals throughout the figures. In order to better appreciate how to obtain the above-recited and other advantages and objects of various embodiments, a more detailed description of the inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF ILLUSTRATED EMBODIMENTS

Various embodiments are directed to a method, system, and computer program product for implementing correct-by-construction physical designs with multiple-patterning-awareness. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-7.

Figure 1:
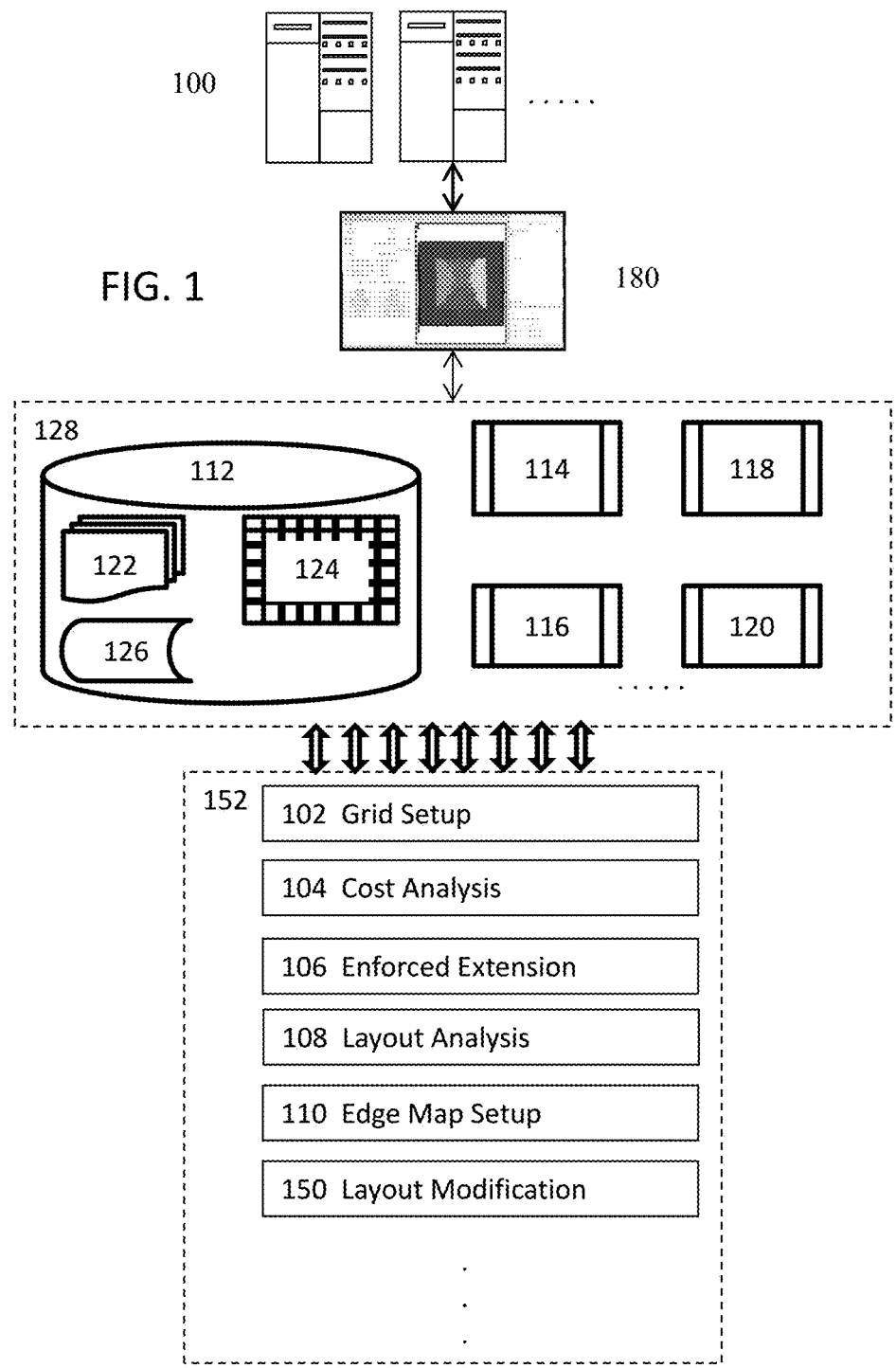
FIG. 1 illustrates a schematic representation of exemplary implementations for implementing correct-by-construction physical designs with multiple-patterning-awareness in some embodiments.

FIG. 1 illustrates a schematic representation of exemplary implementations for implementing multiple-patterning-aware correct-by-construction layout processing for an electronic design in some embodiments. In one or more embodiments, the system for implementing physical design decomposition with custom connectivity may comprise one or more computing systems 100, such as a general purpose computer described in the System Architecture Overview section to operate on an electronic design in a user interface 180 in order to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), edge map(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128, invoke various software, hardware modules, or a combination thereof 152 that may comprise a grid setup module 102 to determine various characteristics of and set up one or more sets of grids for a layer of an electronic design, cost analysis module 104 to perform one or more cost analyses to determine, for example, grid pitches or which grids are to be used by the enforced extension module for a specific shape in the design, a enforced extension module 106 to perform enforced extension for one or more shapes in a design, a layout analysis modules 108 to analyze a layout or design to identify various characteristics, parameters, etc. for one or more layers in the layout or design, an edge map set up module 110 to extract design data from a design and to populate one or more edge maps or data structures with extracted data, or a layout or design modification module 150 to modify a layout or design by, for example, using the enforced extension module 106.

Figure 2:
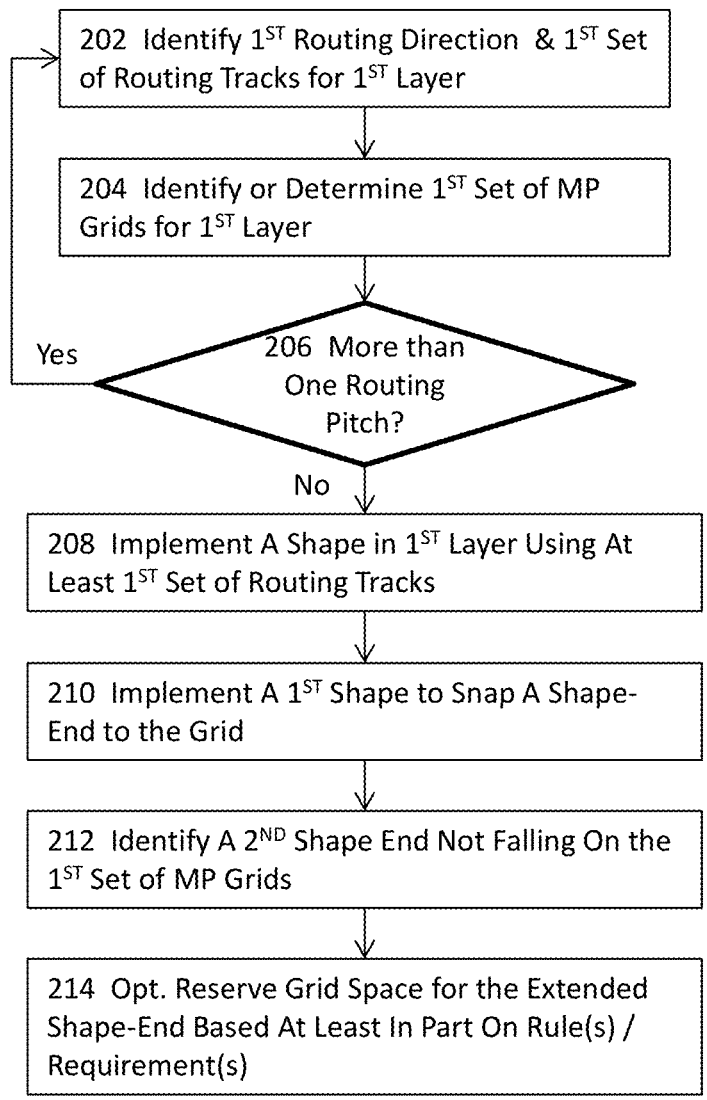
FIG. 2 illustrates a top level flow diagram for implementing correct-by-construction physical designs with multiple-patterning-awareness in some embodiments.

FIG. 2 illustrates a top level flow diagram for implementing correct-by-construction physical designs with multiple-patterning-awareness in some embodiments. In one or more embodiments, the method for implementing correct-by-construction physical designs with multiple-patterning-awareness illustrated in FIG. 2 may include the process 202 of identifying a first routing direction and a first set of routing tracks for a first layer of an electronic design. In some embodiments, a layer includes a routing layer or a metal layer. In some embodiments, a layer may allow only one routing direction (e.g., the preferred routing direction). In these embodiments, a lay may have only the right-way routing tracks and thus the right-way wires or interconnects (hereinafter interconnects). In these embodiments, the layers are stacked in an electronic design such that two adjacent layers have alternating routing directions. In some embodiments, a layer may have both routing directions (e.g., the preferred routing direction and the non-preferred routing direction).

In some embodiments, the method illustrated in FIG. 2 may comprise the process 204 of identifying or determining a first set of multiple-exposure (MP) grids for the first layer. In some embodiments, the first set of grids is used for multiple patterning or multiple exposure lithography processes, such as a self-aligned double patterning lithography process. More details about identifying or determining a set of MP grids are described in FIGS. 4, 4A-B, and 6A-C and their respective description as well as U.S. application Ser. No. 13/840,259 entitled "METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN" the content of which is hereby incorporated by reference in its entirety for all purposes.

In some embodiments, the method illustrated in FIG. 2 may comprise the process 206 of determining whether there is more than one routing pitch to implement the physical design for the first layer. In some embodiments where it is determined that the first layer is to be implemented with a uniform routing pitch, the method may proceed to 208. Otherwise, the method returns to 202 to identify the next set of routing tracks with the next routing pitch and repeats the processes 202~206 until all routing tracks with different routing pitches have been processed.

In some embodiments, the method illustrated in FIG. 2 may comprise the process 208 of implementing a first shape in the first layer using at least the first set of routing tracks. In various embodiments, a routing track comprises an imaginary line that is used by physical design implementation tools (e.g., a router such as the routing engine described in U.S. application Ser. No. 13/465,917 which is filed on May 7, 2012 and is entitled "METHODS, SYSTEMS, AND ARTICLES OF MANUFACTURE FOR IMPLEMENTING A PHYSICAL ELECTRONIC CIRCUIT DESIGN WITH MULTIPLE-PATTERNING TECHNIQUES", the content of which is hereby incorporated by reference in its entirety for all purposes) to lay out the center of a via or the centerline of an interconnect or wire (hereinafter interconnect). A set of routing tracks includes a plurality of such tracks that are parallel to each other with the routing pitch as the spacing between two adjacent tracks. A routing layer may include one or more sets of routing tracks, each having the same or a different routing pitch in some embodiments. Therefore, routing tracks on a single routing layer may have uniform or non-uniform routing pitch. For example, the process 208 may use the routing tracks to lay the centerlines of interconnects.

In some embodiments, the method illustrated in FIG. 2 may comprise the process 210 of implementing the first shape to extend a first shape-end of the first shape to a grid of the first set of MP grids. For example, process 210 may be used to route an interconnect from its originating location to its end location. Process 210 will then ensure that both shape ends of the interconnect fall on appropriate grids of the first set of grids.

In some embodiments, the method illustrated in FIG. 2 may optionally comprise the process 212 of identifying a second shape with a shape end that does not fall on any grid of the first set of grids. In these embodiments, the electronic design may have one or more existing design elements (e.g., some interconnects), and process 212 may then identify the second shape end that does not fall on any grid and extend the second shape end to an appropriate grid of the first set of grids.

In some embodiments, the method illustrated in FIG. 2 may optionally comprise the process 214 of reserving a grid space for the extended shape-end based at least in part on one or more rules, constraints, or requirements (hereinafter rules). The one or more rules may comprise, for example but not limited to, performance requirements related to the specific shape being implemented, criticality of the shape or the block of design including the shape, etc. In some embodiments, process 214 reserves some additional space for an interconnect in the direction of routing the interconnect. The reservation of this additional space may further push other design elements away from the interconnect due to, for example, the minimum spacing rule. One of the advantages of some embodiments is that the layout implemented with various processes described herein is correct by construction in that the layout is generated without any violations of the coloring requirements for various design components with respect to rules for the multiple exposure lithography process or violations of any trim mask rules such as those shown in FIG. 5B. This is especially advantageous because conventional DRC for trim mask rules may take up to several months to complete due at least partially to the directionality of the trim mask rules where, for example, the routing pitches are no longer uniform in adjacent layers, spacing requirements for two routing directions are no longer the same, and interconnects approaching from the right (or top) and interconnects approaching from the left (or bottom) are no longer treated equally, especially for advanced technology nodes with, for example, 14-nm or even 10-nm nodes. Another advantage of some embodiments is that the layout implemented with various processes described herein needs not be a complete layout in order to ensure correctness by construction. In other words, a physical design may thus be partitioned into multiple smaller portions, each of which can be implemented individually and independently in, for example, a grid computing environment or a parallel processing environment, and each of which will be correct by construction and free of any violations of the coloring requirements for various design components with respect to rules for the multiple exposure lithography process or violations of any trim mask rules.

Figure 2A:
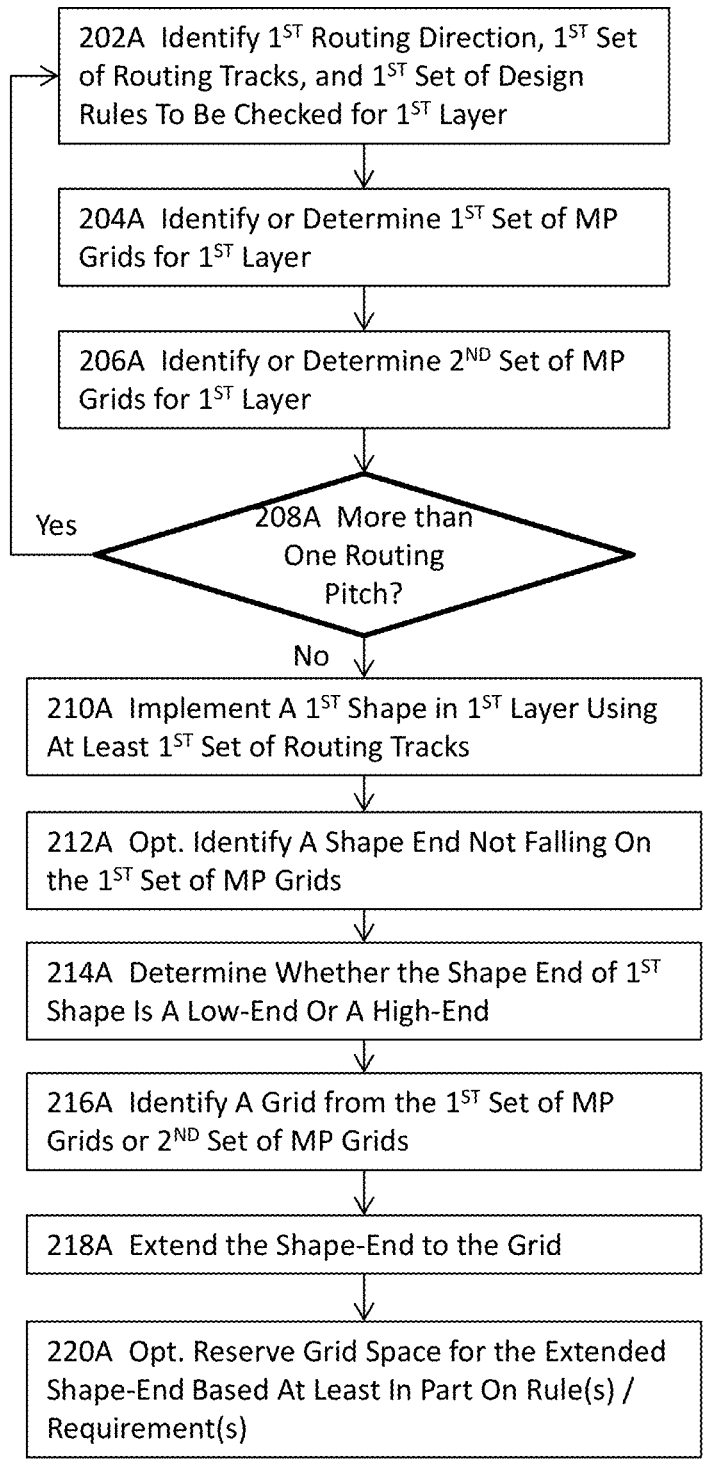
FIG. 2A illustrates a more detailed flow diagram for implementing correct-by-construction physical designs with multiple-patterning-awareness in some embodiments.

FIG. 2A illustrates a more detailed flow diagram for implementing correct-by-construction physical designs with multiple-patterning-awareness in some embodiments. In the embodiment(s) illustrated in FIG. 2A, two sets of MP grids (the set of high grids and the set of low grids) are used to implement physical designs such that the high-ends of shapes are implemented to fall on the set of high grids, and the low-ends of shapes are implemented to fall on the set of low grids. In one or more embodiments, the method for implementing correct-by-construction physical designs with multiple-patterning-awareness illustrated in FIG. 2A may include the process 202A of identifying a first routing direction, a first set of routing tracks, and a first set of design rules to be checked for $1^{st}$ layer.

In some embodiments, the method illustrated in FIG. 2A may comprise the process 204A of identifying or determining a first set of grids for the first layer. In some embodiments, the first set of MP grids comprises a set of higher grids on which high-ends of shapes are implemented to fall.

In some embodiments, the method illustrated in FIG. 2A may comprise the process 206A of identifying or determining a second set of MP grids for the first layer. In some embodiments, the second set of MP grids comprises a set of lower grids on which low-ends of shapes are implemented to fall. In some embodiments, a high-end of a shape denotes a first end of the shape along the routing direction, and a low-end of a shape denotes the opposing end of the high-end. For example, a straight interconnect in the horizontal routing direction may have a high-line-end to the right of the interconnect and a low-line-end to the left of the interconnect. As another example, a straight interconnect in the vertical routing direction may have a high-line-end to the top of the interconnect and a low-line-end to the bottom of the interconnect.

In some embodiments, the method illustrated in FIG. 2A may comprise the process 208A of determining whether or not there are more than one routing pitch for the first layer. In some embodiments where it is determined that the first layer is to be implemented with a uniform routing pitch, the method may proceed to 210A. Otherwise, the method returns to 202A to identify the next set of routing tracks with the next routing pitch and repeats the processes 202A~208A until all routing tracks with different routing pitches have been processed.

In some embodiments, the method illustrated in FIG. 2A may comprise the process 210A of implementing a first shape in the first layer using at least the first set of routing tracks. In these embodiments, process 210A implements the first shape for the first layer anew.

In some embodiments, the method illustrated in FIG. 2A may optionally comprise the process 212A of identifying a shape with a shape-end that does not fall on any grid of the first set of grids. In these embodiments, the electronic design may have one or more existing design elements (e.g., some interconnects), and process 212A may then identify the shape-end that does not fall on any grid and extend the shape-end to an appropriate grid of the first set of grids.

In some embodiments, the method illustrated in FIG. 2A may comprise the process 214A of determining whether a shape-end of the first shape is a low-end or a high-end.

In some embodiments, the method illustrated in FIG. 2A may comprise the process 216A of identifying a grid from the first set of grids or the second set of grids based at least in part upon the determination results of 214A. In some embodiments where process 214A may determine that a shape-end of the first shape is the high-end of the first shape, process 216A may identify an appropriate grid in the higher grids. In some embodiments where process 214A may determine that a shape-end of the first shape is the low-end of the first shape, process 216A may identify an appropriate grid in the lower grids. In some embodiments, process 216A identifies the closest grid from the appropriate set of grids (the first set or the second set) and the next closest grids from the same set of grids.

In some embodiments, the method illustrated in FIG. 2A may comprise the process 218A of extending the shape-end to the grid identified at 216A. For example, if process 214A determines that a specific line-end of interest of an interconnect is a high-line-end, process 216A may identify the grid that is closest to the specific line-end from the higher grids (e.g., the first set of grids) and optionally identify the next closest grids from the same set of grids, and process 218A may then first extend the specific line-end of the interconnect to the closest grid in some embodiments. In some embodiments, the method may further perform some checks for the first shape being implemented to determine the extended first shape at 218A satisfies some rules (e.g., the rules identified at 202A) on the fly. If the method determines that the extended first shape does not satisfy these rules, process 218A may further extend the specific line-end, which has been extended to the closest grid, to the next closest grid and repeat the check-extend process until the rules are satisfied. In some embodiments, the method may use the processes described in U.S. application Ser. No. 13/840,259 entitled "METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN" to determine an edge map or a grid map for the layout generated to perform a constant-time design rule check on the fly. Because each design rule checking task with the edge map or grid map is done within a constant time, instead of an order of n or an order of log(n) as conventional DRC checks, various embodiments may perform the DRC on the fly or in real-time.

In some embodiments, the method illustrated in FIG. 2A may optionally comprise the process 220A of reserving some additional space for the extended shape-end based at least in part on one or more rules in a substantially similar manner as that described for 214.

Figure 2B:
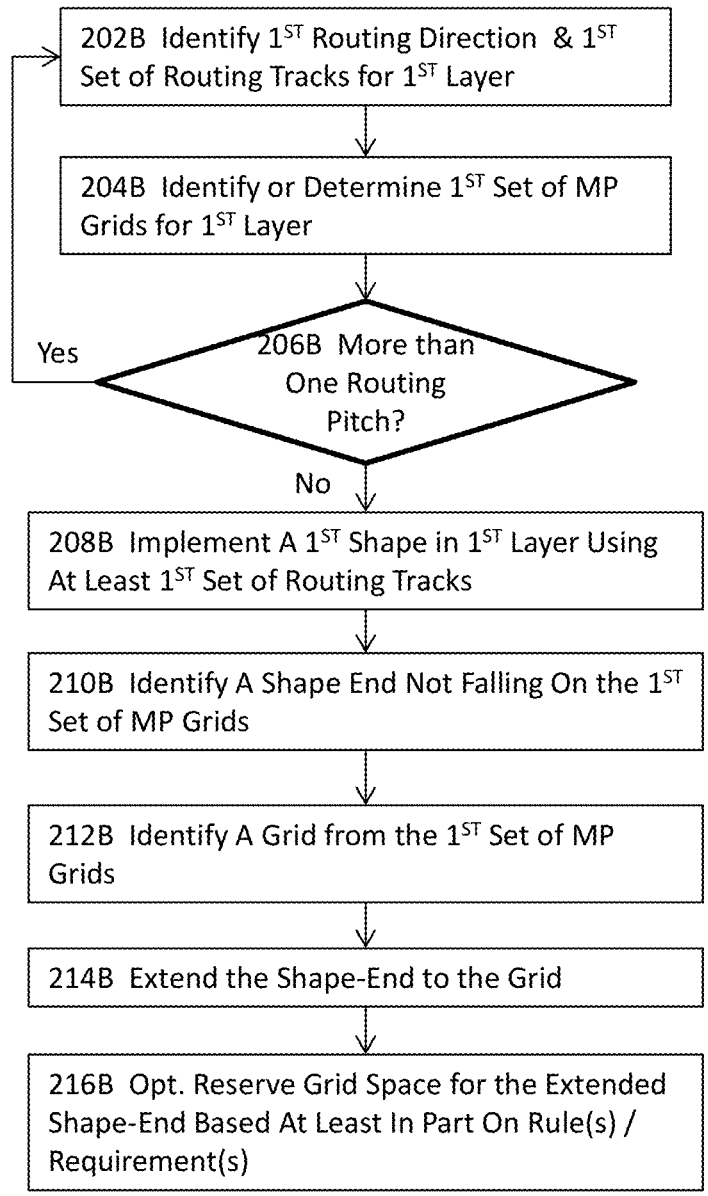
FIG. 2B illustrates a more detailed flow diagram for implementing correct-by-construction physical designs with multiple-patterning-awareness in some embodiments.

FIG. 2B illustrates a more detailed flow diagram for implementing correct-by-construction physical designs with multiple-patterning-awareness in some embodiments. In the embodiment(s) illustrated in FIG. 2B, only one set of MP grids is used to implement physical designs such that both the high-ends and the low-ends of shapes are implemented to fall on the set of grids. In one or more embodiments, the method for implementing correct-by-construction physical designs with multiple-patterning-awareness illustrated in FIG. 2B may include the process 202B of identifying a first routing direction and a first set of routing tracks for the first layer of an electronic design.

In some embodiments, the method illustrated in FIG. 2B may comprise the process 204B of identifying or determining a first set of MP grids for the first layer in a substantially similar manner as those described for 204, 204A, and 206A.

In some embodiments, the method illustrated in FIG. 2B may comprise the process 206B of determining whether or not there are more than one routing pitch for the first layer. In some embodiments where it is determined that the first layer is to be implemented with a uniform routing pitch, the method may proceed to 208B. Otherwise, the method returns to 202B to identify the next set of routing tracks with the next routing pitch and repeats the processes 202B-206B until all routing tracks with different routing pitches have been processed.

In some embodiments, the method illustrated in FIG. 2B may comprise the process 208B of implementing a first shape in the first layer using at least the first set of routing tracks. In some embodiments, process 208B may use a routine engine to implement the first shape for the first layer. In some embodiments, process 208B may use the routing engine that is described in U.S. application Ser. No. 13/465,917 which is filed on May 7, 2012 and is entitled "METHODS, SYSTEMS, AND ARTICLES OF MANUFACTURE FOR IMPLEMENTING A PHYSICAL ELECTRONIC CIRCUIT DESIGN WITH MULTIPLE-PATTERNING TECHNIQUES", the content of which is hereby incorporated by reference in its entirety for all purposes.

In some embodiments, the method illustrated in FIG. 2B may comprise the process 210B of identifying a first shape with a shape-end that does not fall on any grid of the first set of grids. Traditional routing engines may be used in conjunction with various embodiments described herein but may not ensure that all shapes terminate on grids. Therefore, process 210B may identify a shape-end of a shape that does not terminate on a grid identified or determined at 204B.

In some embodiments, the method illustrated in FIG. 2B may comprise the process 212B of identifying a grid from the first set of grids. In some embodiments, process 212B identifies the closest grid from the first set of grids and optionally the next closest grids from the same set of grids in a similar manner as that described for 216A.

In some embodiments, the method illustrated in FIG. 2B may comprise the process 214B of extending the shape-end of the first shape to the grid identified at 212B.

In some embodiments, the method illustrated in FIG. 2B may comprise the process 216B of reserving some additional space for the extended shape-end based at least in part on one or more rules in a substantially similar manner as that described for 214.

Figure 2C:
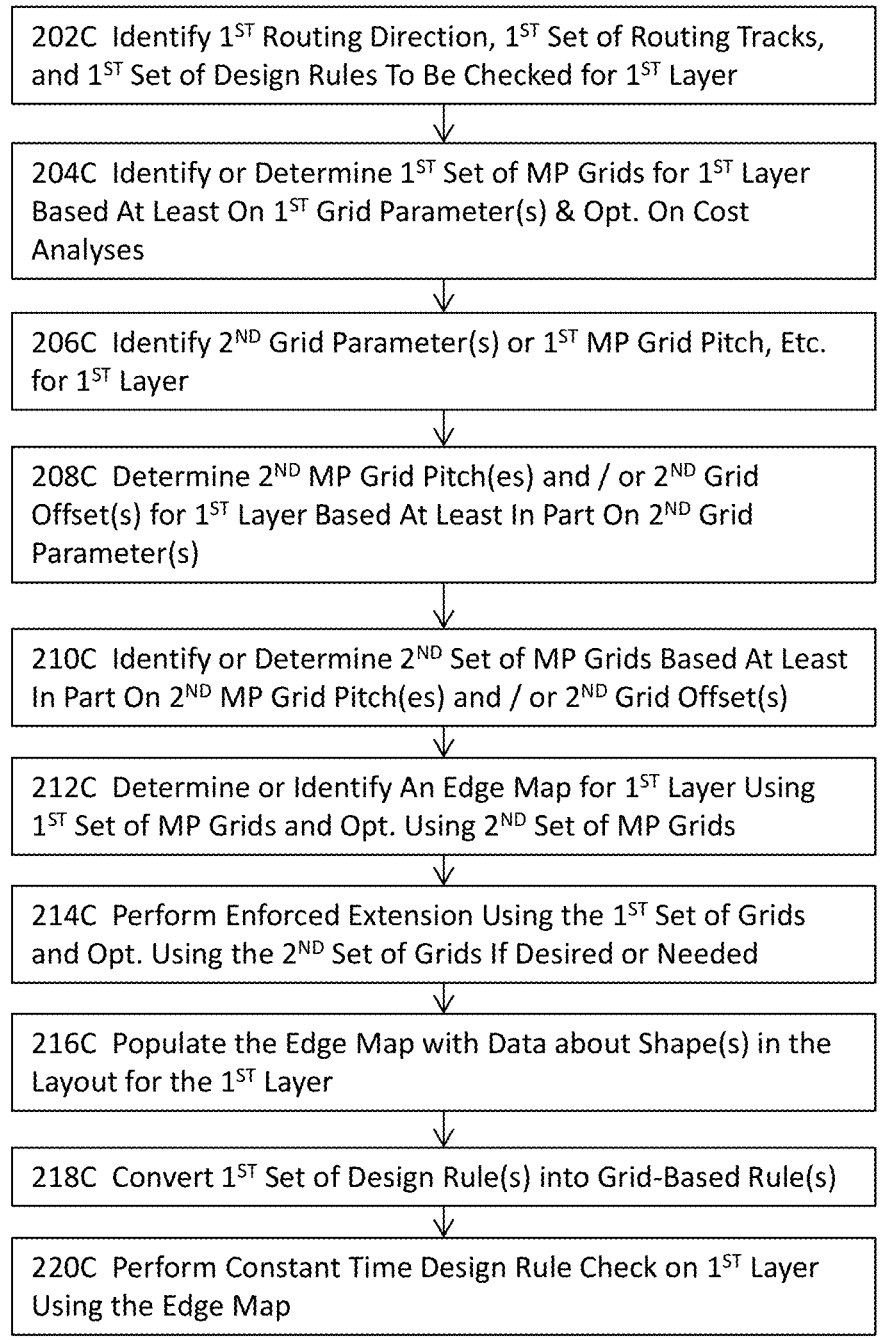
FIG. 2C illustrates a more detailed flow diagram for implementing correct-by-construction physical designs with multiple-patterning-awareness in some embodiments.

FIG. 2C illustrates a more detailed flow diagram for implementing multiple-patterning-aware correct-by-construction layout processing for an electronic design in some embodiments. In one or more embodiments, the method for implementing multiple-patterning-aware correct-by-construction layout processing for an electronic design illustrated in FIG. 2C may comprise the process 202C of Identify a first routing direction, a first set of routing tracks, and a first set of design rules to be checked for the first layer. In some embodiments, the method may include the process 204C of identifying or determining a first set of MP grids for the first layer based at least on one or more first grid parameters and optionally on results of cost analyses. In some embodiments, the one or more first grid parameters include, for example but not limited to, the grid pitch(es), grid offset(s), grid direction(s), or any combinations thereof, etc. for the first set of grids.

In some embodiments, the method may include the process 206C of identifying one or more second grid parameters for the second set of grids or one or more first grid parameters for the first set of grids, etc. for the first layer. In some embodiments, the one or more first grid parameters include, for example but not limited to, the grid pitch(es), grid offset(s), grid direction(s), or any combinations thereof, etc. for the second set of grids. In some embodiments where process 206C identifies one or more second grid parameters, the method may then uses these one or more second grid parameters to determine the second set of grids.

In some embodiments, the method may include the process 208C of determining the second grid pitch(es), the second grid offset(s), and/or the second grid direction(s) for the first layer based at least in part on the one or more second grid parameters or on the one or more first grid parameters. In some embodiments where process 206C identifies the parameters of the first set of grids, the process 208C may then infer or directly use the parameters of the first set of grids for the second set of grids. For example, the process 208C may use the first grid pitch of the first set of grids for the second set of grids. The process 208C may determine the second grid direction for the second set of grids from the first grid direction of the first set of grids.

In some embodiments, the method may include the process 210C of identifying or determining the second set of grids based at least in part on the second grid pitch(es) and optionally on the second grid offset(s).

In some embodiments, the method may include the process 212C of determining or identifying an edge map for the first layer using the set of grids and optionally using the second set of grids. In some embodiments, an edge map comprises a two-dimensional data structure to represent an abstraction of shapes on a layer. In these embodiments, the two-dimensional data structure includes the routing tracks, the set(s) of grids, each having a uniform pitch or non-uniform pitches. In some embodiments with horizontal routing tracks, every point in the edge map represents, high_line_end (a line-end terminating to the right of the originating point of the interconnect), low_line_end (a line-end terminating to the left of the originating point of the interconnect), through_wire, or blank. In some embodiments with vertical routing tracks, every point in the edge map represents, high_line_end (a line-end terminating above the originating point of the interconnect), low_line_end (a line-end terminating below the originating point of the interconnect), through_wire, or blank. In some embodiments, the processes described herein may identify an existing layout, which may be complete or incomplete, and convert the existing layout into an edge map by using the processes described herein. For example, these embodiments may identify the routing pitch(es) from the routed design components in the existing layout, determine the set(s) of grids based at least in part upon the routing pitch(es) and/or other rules, identify the line-ends of the interconnects, and place the identified line-ends in the edge map to generate the edge map.

One of the advantages of the edge map in physical design implementation is that the use of edge maps enables a constant time design rule checking and a constant time search for one or more shapes that violate a design rule, unlike other conventional approaches that search for shapes within a halo and performs comparison between the identified shapes and the rule and thus require the design rule checking time or a search time in an order (n) with regular design databases or order(log(n)) with a tree structure for the search, where n denotes the total number of shapes in a design. In other words, with the edge map data structure that stores the line ends, various DRC or search processes merely examines the edge map to determine the total number of line ends falling within a search radius or halo. Therefore, the search time and thus the check time are constant regardless of the number of shapes or design elements to be searched or checked. Another advantage of this constant time DRC and constant time search is that various embodiments described herein convert the multiple-exposure physical implementation problem (e.g., DRC or routing), which is global in nature, into a local problem.

In some embodiments, the method may include the process 214C of performing enforced extension using the first set of grids and optionally using the second set of grids if desired or needed. Enforced extension is described in the preceding paragraphs with reference to FIG. 2D.

In some embodiments, the method may include the process 216C of populating the edge map with data for the shapes in the layout of the first layer. More details of the process 216C are described in U.S. application Ser. No. 13/840,259, entitled "METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN" the content of which is hereby incorporated by reference in its entirety for all purposes.

In some embodiments, the method may include the process 218C of converting the first set of design rule(s) to be checked into corresponding grid-based rules. For example, the trim mask minimum step rule 508B of FIG. 5B may require that two neighboring interconnects running in the same direction have a minimum step of 100-nm. If the grid pitch is 40-nm, the trim mask minimum step rule will be converted to a grid-based trim mask minimum width rule that requires at least three grids. Therefore, when checking the edge map to identify violations of this trim mask minimum step rule, the checking engine or the search engine merely has to examine the edge map to determine the total number of line points that fall within a +3 grids/−3 grids halo, and the search time is thus constant, independent of the total number of shapes or elements in the design.

Moreover, various embodiments ensure that a shape is implemented in the layout with the ends of the shape coinciding with certain grids. In the above example where the grid pitch is 40-nm, any interconnects that fall within, for example, +2 grid (or −2 grid) and +3 grid (or −3 grid) will be automatically extended to +3 grid (or −3 grid) and thus automatically satisfy the trim mask minimum step rule. In addition, any interconnects with line-ends falling between 0 and +2 grids (or between 0 and −2 grids) may also be extended by the enforced extension to +3 grid (or −3 grid) and thus also satisfy the trim mask minimum step rule. As another example, some embodiments may determine the grid pitch to be 120-nm. In this example, all interconnects will be routed to ensure the line-ends of each interconnect coincides with appropriate grids. Therefore, no line-ends will fall between 0 and +1 grid (or between 0 and −1 grid, dependent on the direction of the interconnect). As such, all interconnects will be implemented to satisfy the trim mask minimum step rule, and the generated layout is thus correct by construction without any violation of at least this trim mask minimum step rule.

In some embodiments, the method may include the process 220C of performing a constant time design rule check on the first layer using at least the edge map. More details about the design rule check are described in U.S. patent application Ser. No. 13/840,567, entitled "METHODS, SYSTEMS, AND ARTICLES OF MANUFACTURE FOR PERFORMING DESIGN RULE CHECK FOR ELECTRONIC DESIGNS" the content of the three applications is hereby incorporated by reference in its entirety for all purposes.

Figure 2D:
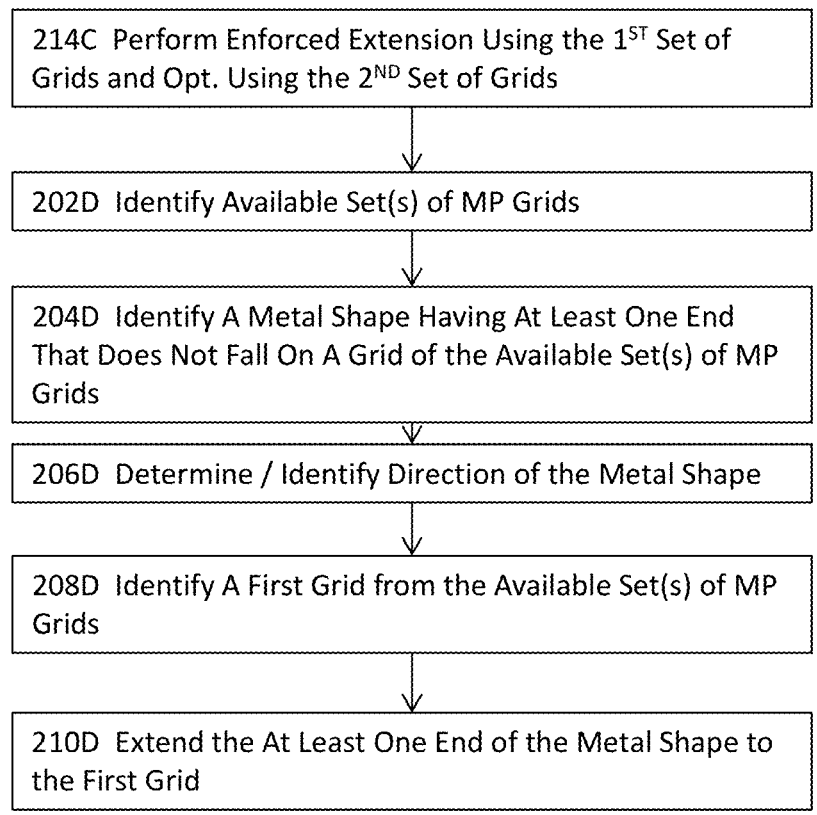
FIG. 2D illustrates more details about the flow diagram for implementing correct-by-construction physical designs with multiple-patterning-awareness illustrated in FIG. 2C in some embodiments.

FIG. 2D illustrates more details about the flow diagram for implementing correct-by-construction physical designs with multiple-patterning-awareness illustrated in FIG. 2C in some embodiments.

More specifically, FIG. 2D illustrates more details about the process 214C. In some of these embodiments, the process 214C may perform enforced extension using the first set of grids and optionally using the second set of grids. In one or more embodiments, the process 214C illustrated in FIG. 2D comprises the process 202D of identifying available sets of grids. In some embodiments where only the first set of MP grids (high grids) is available, process 202D identifies the first set of grids. In some embodiments where both the first set of MP grids (high grids) and the second set of MP grids (low grids) are available, process 202D may identify the high grids, the low grids, or both. In some embodiments, the process 214C may include the process 204D of identifying a metal shape (e.g., an interconnect) that has at least one end that does not fall on a grid of the identified set(s) of grids. For example, process 204D may identify a wire having one line end that does not fall on any grid of the available sets of grids identified at 202D.

In some embodiments, the process 214C may include the process 206D of determining or identifying the direction or orientation of the metal shape. For example, process 206D may identify that the interconnect identified at 204D terminates to the right (or left, above, or below) of the starting point of the interconnect.

In some embodiments, the process 214C may include the process 208D of identifying a first grid from the available sets of grids identified at 204D. For example, process 208D may identify the next closest grid from a set of grids identified at 204D. In these embodiments, the next closest grid is identified at 208D to minimize extension and hence to minimize wire length where the metal shape constitutes an interconnect.

In some embodiments, the process 214C may include the process 210D of extending at least one end of the metal shape to the grid identified at 208D. In the example for 206D above, process 210D may extend the interconnect to the right so that the interconnect terminates at the identified grid identified at 208D. It shall be noted that the method or some other processes (e.g., a design rule check process) may further check to determine whether the metal shape (now extending to the identified grid) satisfies one or more design rules, require-ments, or constraints (collectively "design rules"). If the method or these processes determines that the extended metal shape fails to meet one or more design rules, process 210D may extend at least one end of the metal shape to the next closest grid in the identified sets of grids. In these embodiments, the next closest grid is identified at 208D to minimize extension and hence to minimize wire length where the metal shape constitutes an interconnect. It shall be noted that although various embodiments and exemplary implementations are described to show extending a shape to a grid, a shape may also be contracted to the closest grid and perhaps the next closest grids in a similar manner.

Figure 3A:
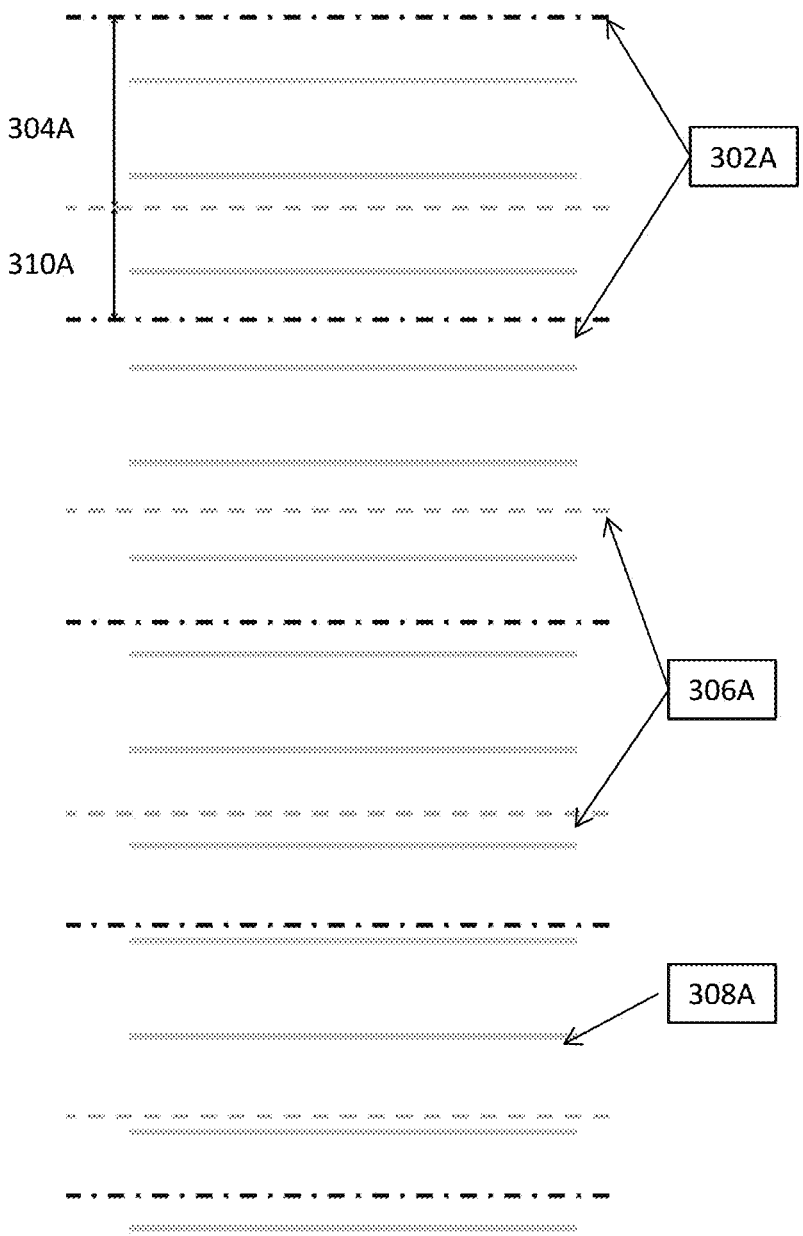
FIGS. 3A-E illustrate some exemplary implementations of a portion of a layer in an electronic design with processes described herein in some embodiments.

FIGS. 3A-E illustrate some exemplary implementations of a portion of a layer in an electronic design with processes described herein in some embodiments. FIG. 3A illustrates a set of lower grids 302A, a set of higher grids 306A, a set of routing tracks 308A, the trim mask spacing 304A, and the trim mask width 310A. In this example illustrated in FIG. 3A, the grid pitch for both the lower grids and the higher grids is determined to be the sum of the trim mask spacing and the trim mask width (or 304A+310A). The offset of both the higher and lower grids is the trim mask spacing, 304A.

Figure 3B:
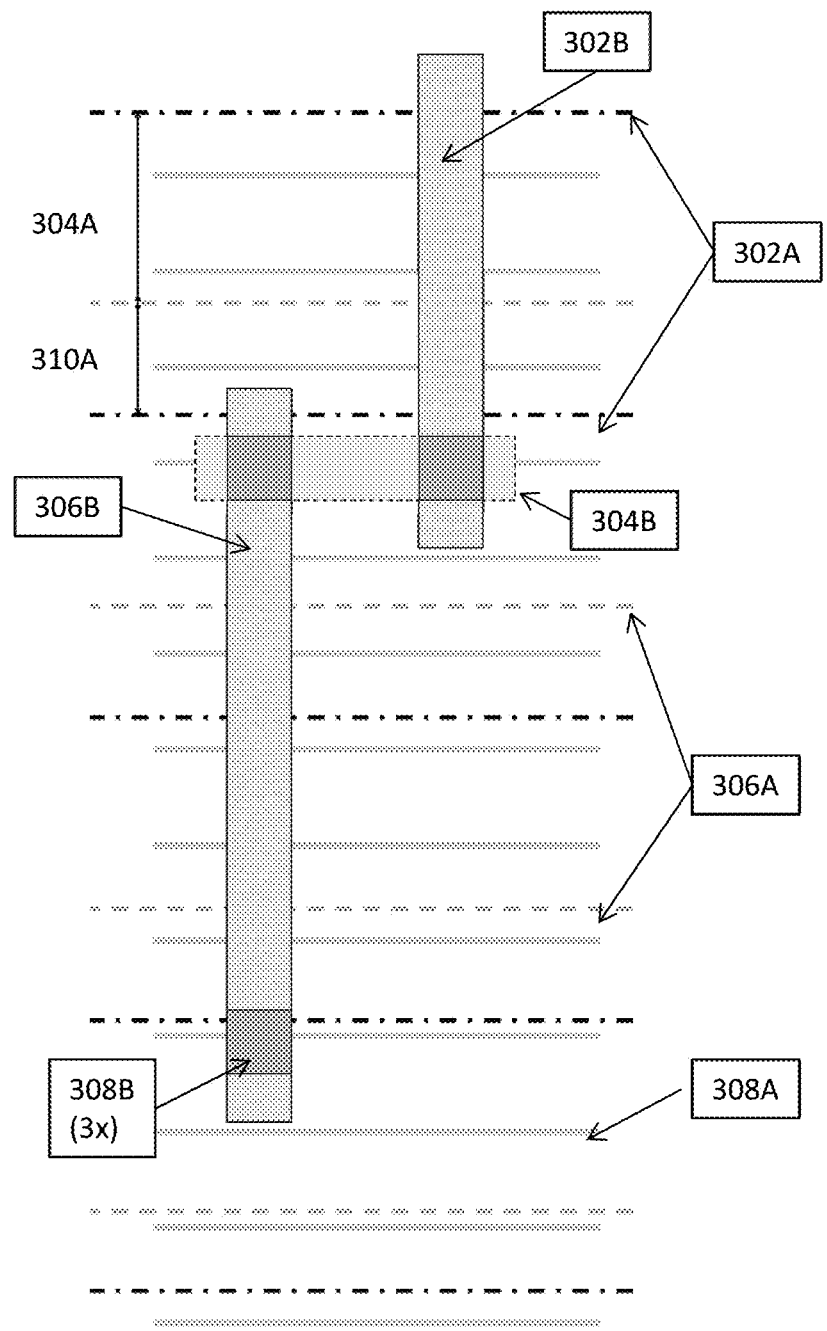

FIG. 3B shows additions of shapes (interconnects and vias) to the layout space. More specifically, FIG. 3B illustrates laying out the center of an interconnect 304B on the first routing layer with a horizontal routing direction along the first set of routing tracks 308A. Interconnects 302B and 306B are laid out along the second set of routing tracks (not shown) on the second routing layer (not shown) that has a vertical routing direction. FIG. 3B further shows the first layer and the routing layer permits one routing direction, and thus only the right-way interconnects are show for each layer. FIG. 3B thus shows the addition of vias (308B) at the interconnects between the first layer interconnect (306B) and the second layer interconnects (302B and 306B).

Figure 3C:
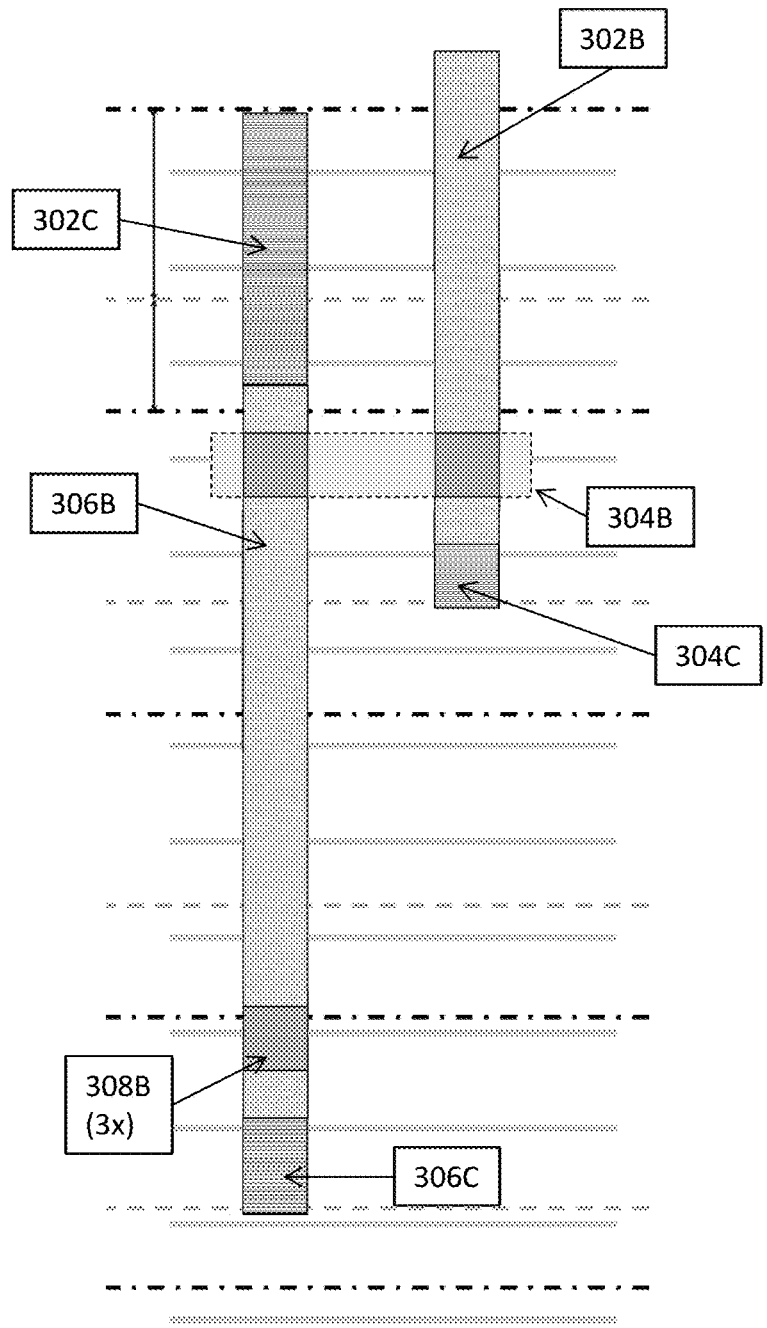

FIG. 3C illustrates the application of various processes described herein. More specifically, FIG. 3C illustrates that both line ends of the interconnect 306B originally do not fall on any grids, and that the low-line-end of interconnect 302B also does not fall on any grid. As a result, various processes extend the high-line-end of 306B to a higher grid to include the segment 302C in the interconnect 306B. Various processes also extend the low-line-end of 306B to a lower grid to include the segment 308C in the interconnect. Similarly, various processes also extend the low-line-end of 302B to a lower grid in the same set of lower grids as that for the extension 306C to include the segment 304C in the interconnect 302B.

Figure 3D:
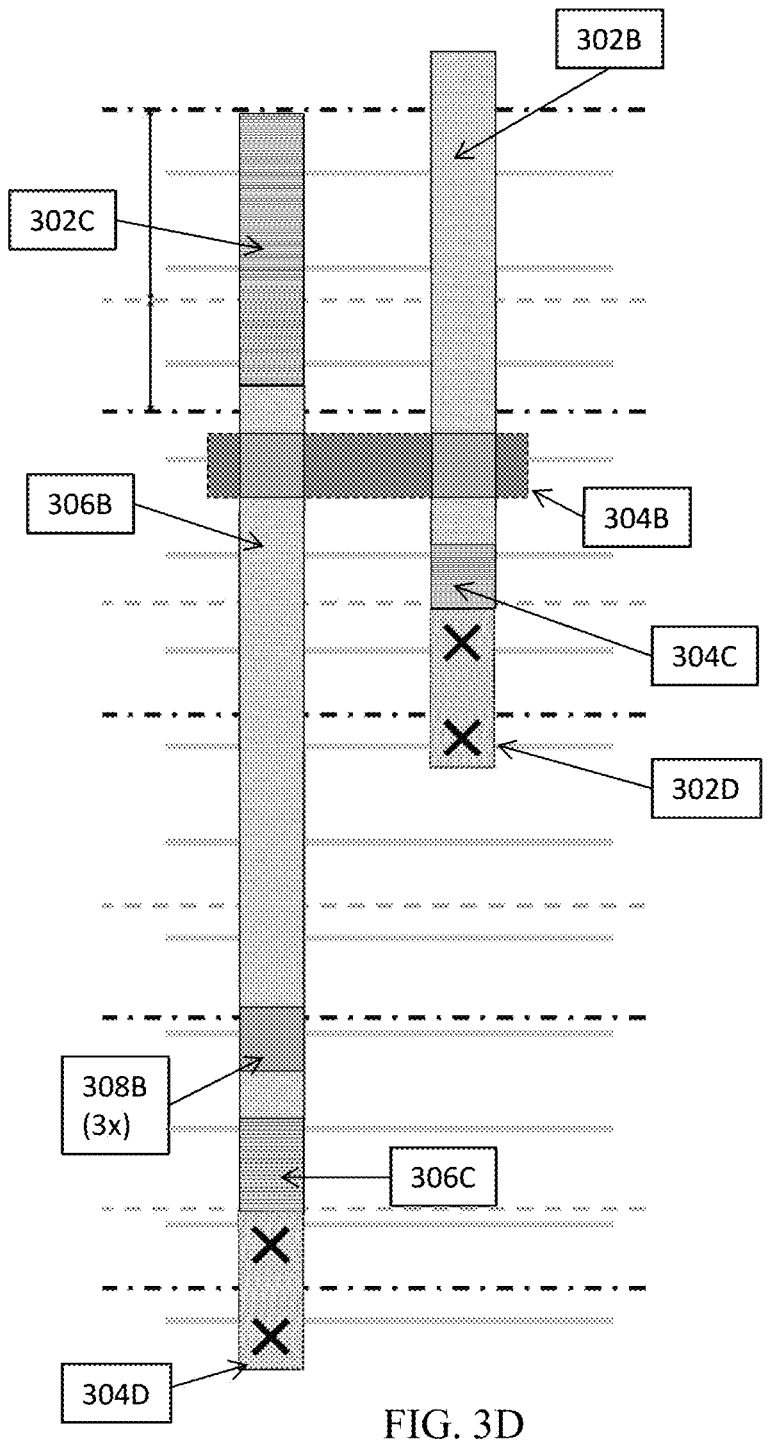

FIG. 3D illustrates the reservation of additional space 304D in the direction of extension when various processes extend the low-line-end of 308B to include the segment 306C in interconnect 306B.

Figure 3E:
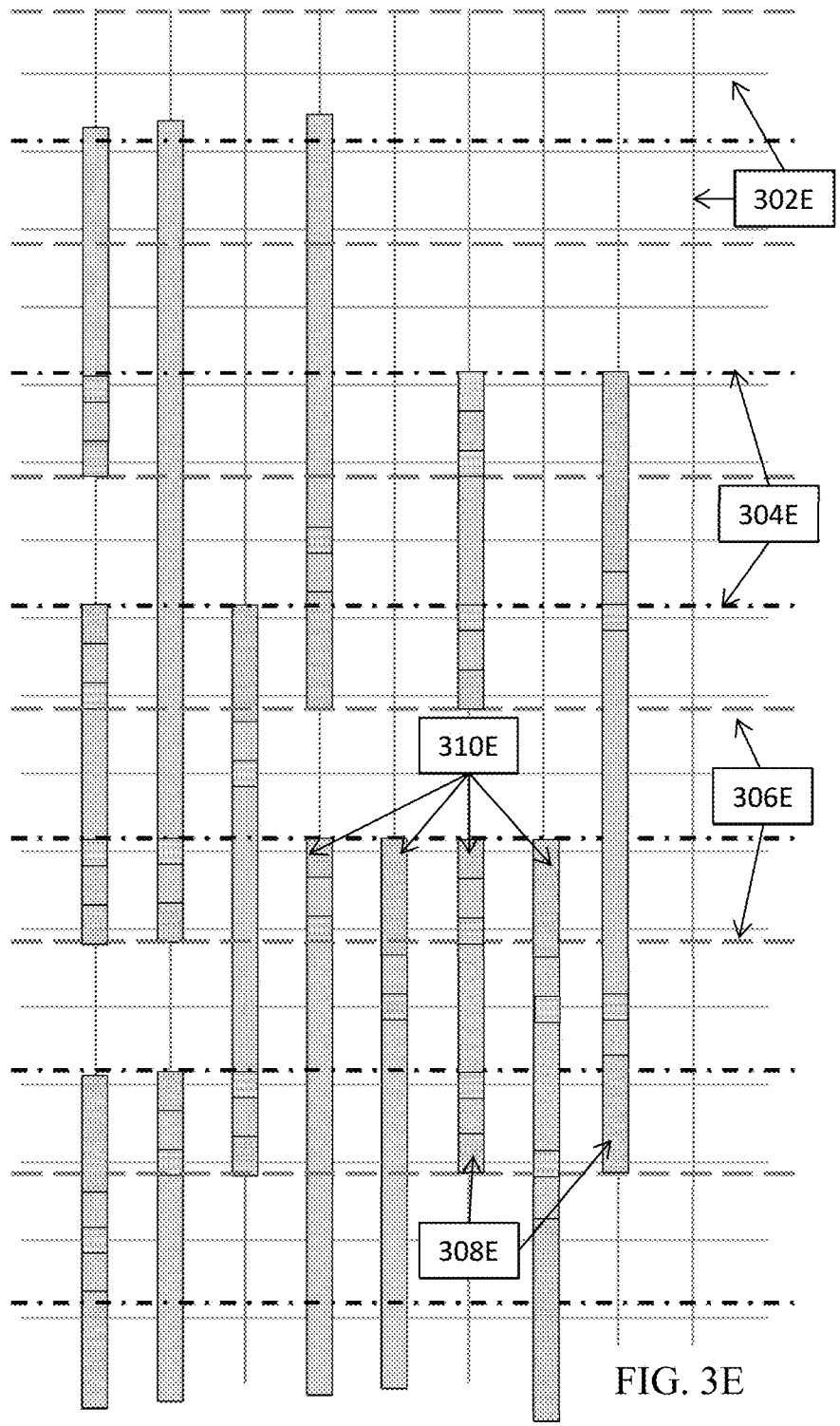

FIG. 3E illustrates a larger portion of a layer in a layout. More specifically, the layer illustrated in FIG. 3E includes a first set of horizontal routing tracks (and optionally a second set of vertical routing tracks) 302E, a first set of grids (e.g., higher grids) 304E, and a second set of grids (e.g., lower grids) 306E). FIG. 3E also shows that high-line-ends 310E of some interconnects to a grid in the first set of grids, and low-line-ends 308E of some interconnects to a lower grid in the second set of grids.

Figure 4:
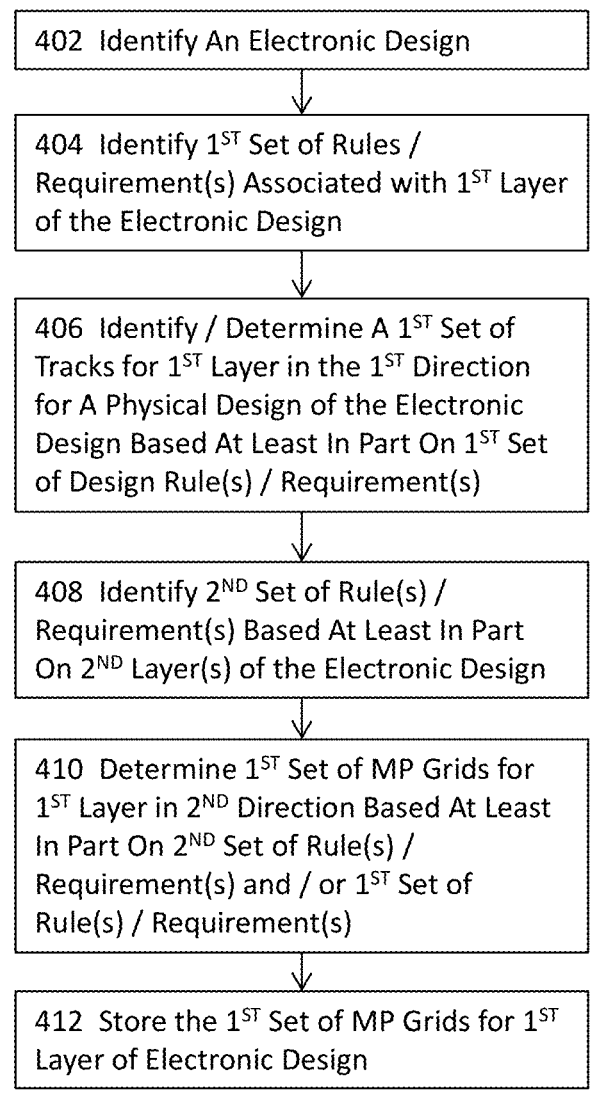
FIG. 4 illustrates a top level flow diagram for implementing multiple-patterning-aware correct-by-construction layout processing for an electronic design that may be used in various processes described herein in some embodiments.

FIG. 4 illustrates a top level flow diagram for implementing multiple-patterning-aware correct-by-construction layout processing for an electronic design that may be used in various processes described herein in some embodiments.

In one or more embodiments, the method for implementing multiple-patterning-aware correct-by-construction layout processing for an electronic design illustrated in FIG. 4 may include the process 402 of identifying an electronic design. In some embodiments, process 402 identifies a layer of an electronic design, where the design for the layer may be complete, incomplete, or may even contain no design elements at all (an empty design space). In some embodiments where the layer is complete or incomplete yet includes some design elements, various embodiments may use various processes described herein to convert existing design elements and to add new design elements to complete processing the design for the layer of the electronic design. In some embodiments where the layer does not include any design elements, various embodiments may start anew and use various processes described herein to implement new design elements to generate the design for the layer of the electronic design. In some embodiments, the method may include process 404 of identifying a first set of one or more rules, constraints, or requirements (hereinafter rules) associated with the first layer of the electronic design. In some embodiments, a layer includes a routing layer or a metal layer on which interconnects or wires in one or both routing directions may be used. In some embodiments, the first set of one or more rules may include, for example but not limited to, one or more design rules, the routing pitch for a routing layer. In addition or in the alternative, the first set of one or more rules may include, for example, the size of technology nodes, one or more routing pitch rules such as a rule that requires the routing pitch is to be the integral multiple of the grid pitch, the routing pitch(es) for adjacent routing layer(s), via cut size rule, via cut enclosure rule, one or more design rules, or one or more trim mask (block mask) rules, or combinations thereof, etc.

In some embodiments, the method may include process 406 of identifying or determining a first set of tracks for the first layer in the first direction for a physical design of the electronic design based at least in part on the first set of one or more rules. In some embodiments, the first set of tracks include a set of routing tracks. In some embodiments, the first direction comprises the preferred routing direction for the first layer. For example, process 406 may use the routing pitch identified at 404 to identify or determine the first set of routing tracks for the first layer of the electronic design. In various embodiments, a routing track comprises an imaginary line that is used by physical design implementation tools (e.g., a router) to lay out the center of a via or the centerline of an interconnect or wire (hereinafter interconnect). A set of routing tracks includes a plurality of such tracks that are parallel to each other with the routing pitch as the spacing between two adjacent tracks. A routing layer may include one or more sets of routing tracks, each having the same or a different routing pitch in some embodiments. Therefore, routing tracks on a single routing layer may have uniform or non-uniform routing pitch.

In some embodiments, the method may include process 408 of identifying a second set of one or more rules based at least in part on one or more characteristics of one or more second layers of the electronic design. In some embodiments, a second layer includes a routing layer or a metal layer on which interconnects or wires in one or both routing directions may be used. In some embodiments, the second layer is situated immediately above or immediately below the first layer. In some embodiments, process 408 identifies the second set of rules based at least in part upon both the layer immediately above the first layer and the layer immediately below the first layer. In some embodiments, the second set of one or more rules include, for example but not limited to, the routing pitch(es) for the routing tracks on the second layer(s), via cut size rule, via cut enclosure rule, one or more design rules, or one or more trim mask (block mask) rules, or combinations thereof, etc. It shall be noted that the term "trim mask" and the term "block mask" are used interchangeably throughout the application.

In some embodiments, the method may include process 410 of determining a first set of multiple-exposure (MP) grids for the first layer in a second direction based at least in part on the second set of one or more rules and/or the first set of one or more rules. In some embodiments, process 410 determines the first set of MP grids based on the rule(s) of the second layer(s) so that the first set of MP grids may be used to terminate a line end of an interconnect as described in subsequent paragraphs. In some embodiments, the first set of grids is used for multiple patterning or multiple exposure lithography processes, such as a self-aligned double patterning lithography process. For example, process 410 may determine the first set of grids for the first layer by using at least the routing pitch of one adjacent routing layer and a rule that requires the routing pitch of the adjacent routing layer be an integral multiple of the grid pitch of the first set of grids in some embodiments. For example, if the routing pitch is 120-nm for metal layer 2 (M2), process 410 may determine that the grid pitch of the first set of grids to be 60-nm for the first metal layer (M1) such that the routing pitch of M2 (120-nm) is twice the grid pitch (60-nm) for the first set of grids in some embodiments. In this example, the process may thus determine the first set of grids with the grid pitch. In some embodiments, the process 410 may also determine the first set of grids for the first layer by using the via cut size rule and the via cut enclosure rule of an adjacent layer to determine the offset of the first set of grids and using the routing pitch of the adjacent routing layer to determine the grid pitch of the first set of grids on the first layer. As another example where the first routing layer is sandwiched between the third routing layer (M3) having 80-nm routing pitch and the second routing layer having 120-nm routing pitch, process 410 may determine the grid pitch for the first set of grids on the first layer to be 40-nm such that the M3 routing pitch (80-nm) is twice the grid pitch (40-nm), and that the M2 routing pitch (120-nm) is three times the grid pitch (40-nm). In this example, process 410 uses the greatest common divisor (GCD) or a common divisor of the routing pitches of adjacent layers as the grid pitch in some embodiments. More details about the offset and the relationship between the routing pitch and the grid pitch will be provided in subsequent paragraphs. In some embodiments where the adjacent routing layers have non-uniform routing pitches, the first set of grids may also have multiple grid pitches that are determined based at least in part upon the non-uniform routing pitches of the adjacent routing layers.

In some embodiments, the method may include process 412 of storing the first set of grids for the first routing layer of electronic design in, for example, an edge map or using the first set of tracks and the first set of grids to implement or improve a physical design of the electronic design.

Figure 4A:
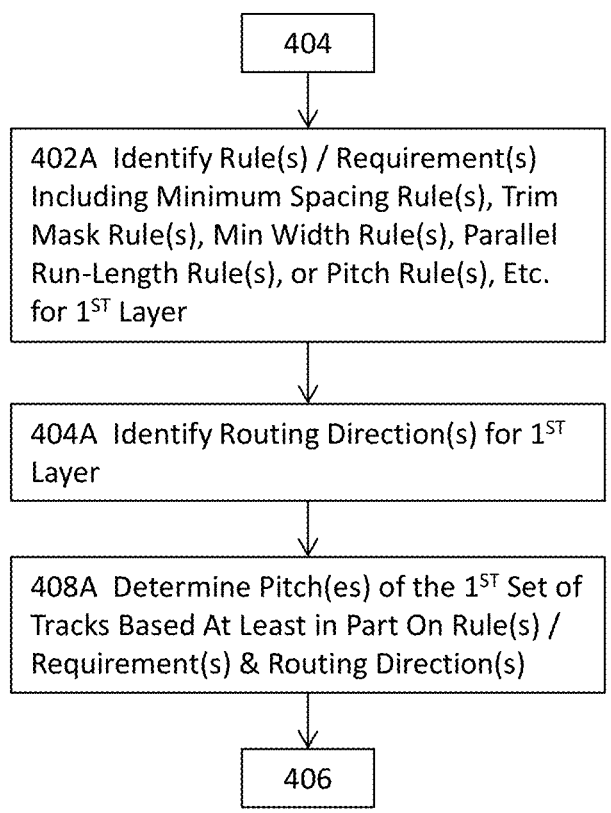
FIG. 4A illustrates more details about the flow diagram for implementing multiple-patterning-aware correct-by-construction layout processing for an electronic design illustrated in FIG. 4 in some embodiments.

FIG. 4A illustrates more details for the flow diagram of FIG. 4 in some embodiments. More specifically, FIG. 4A illustrates more details about the method including process 404 and process 406 of FIG. 4. In some embodiments, process 404 may comprise the process 402A of identifying one or more rules for the first layer. In some embodiments, the one or more rules include, for example but not limited to, one or more minimum spacing rules, one or more trim mask rules, one or more core mask rules (e.g., a sidewall adjacency rule, minimum corner-to-corner rule, minimum spacing rule, or the minimum width rule, etc.), one or more min width rules, one or more parallel run-length rules, one or more pitch rules, any combinations thereof, etc. for the first layer. In some embodiments illustrated in FIG. 4A, the one or more rules identified at 402A are to be used or enforced by the physical implementation tools to determine the grid pitch of the first set of grids such that interconnects automatically obey these rules as the interconnects are being constructed by the physical implementation rules.

In some embodiments, process 404 may comprise the process 404A of identifying one or more routing directions for the first layer. In various embodiments, the direction of the first set of grids of a layer is perpendicular to the routing direction of the same layer. Therefore, the identification of the routing direction of one layer at 404A will be used to determine the direction of the first set of grids for the same layer.

In some embodiments, process 404 may comprise the process 406A of identifying or determining one or more routing pitches of the first set of tracks based at least in part on the one or more rules and the one or more routing directions of the first layer. The process illustrated in FIG. 4 may then proceed to 406.

Figure 4B:
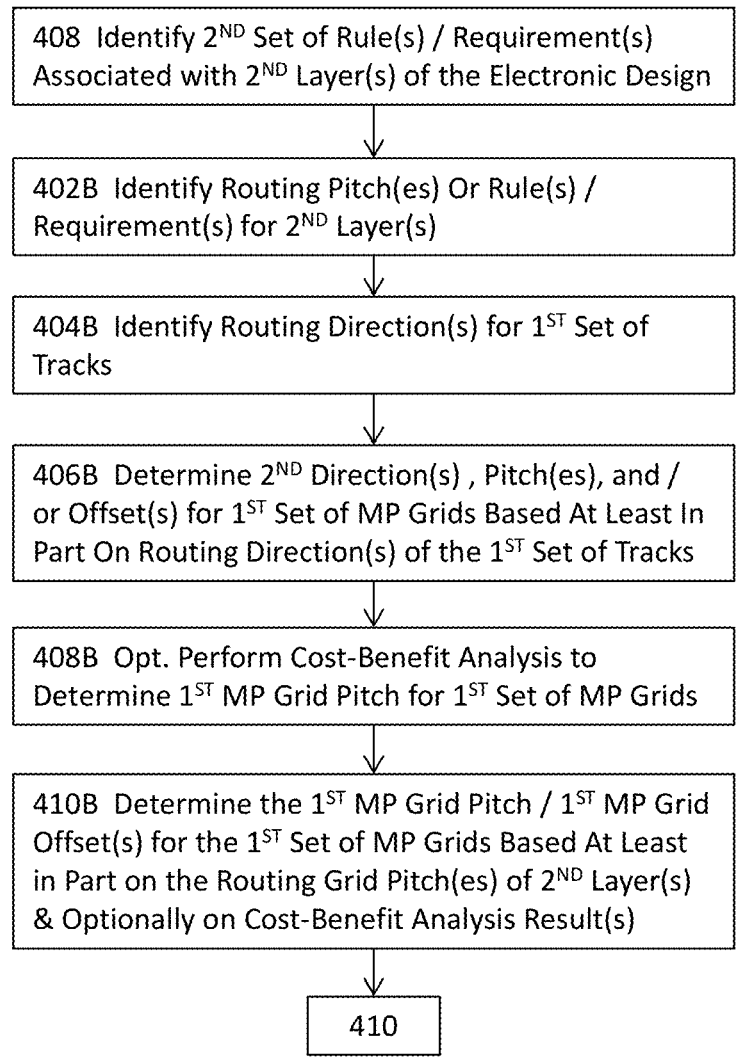
FIG. 4B illustrates more details about the flow diagram for implementing multiple-patterning-aware correct-by-construction layout processing for an electronic design illustrated in FIG. 4 in some embodiments.

FIG. 4B illustrates more details for the flow diagram of FIG. 4 in some embodiments. More specifically, FIG. 4B illustrates more details about process 408 of FIG. 4. In some embodiments, process 408 may include the process 402B of identifying one or more routing pitches or one or more rules for one or more second layers adjacent to the first layer. As described in FIG. 4, an integral multiple of the grid pitch of a layer is equal to the routing pitches of the adjacent layers of the layer. Therefore, process 402B may identify one or more routing pitches for one or both adjacent layers such that the one or more routing pitches may be used later to determine the grid pitch(es).

In some embodiments, process 408 may include the process 404B of identifying one or more routing directions for the first set of tracks. In some embodiments where only the right-way tracks are permitted for a routing layer, process 404B identifies a single routing direction (e.g., the preferred routing direction) for the first set of tracks. In some embodiments where both the right-way tracks and the wrong-way tracks are permitted for a routing layer, process 404B may identify both routing directions (e.g., both the preferred routing direction and non-preferred routing direction) for the first set of tracks.

In some embodiments, process 408 may include the process 406B of determining one or more second directions, one or more pitches, and/or one or more offsets for the first set of grids based at least in part on the one or more routing directions of the first set of tracks. As presented above in the description of FIG. 4, a routing layer may include routing tracks in a first routing direction with a uniform routing pitch or with non-uniform routing pitches; the direction of a set of MP grids for a set of routing tracks is perpendicular to a routing direction of the set of routing tracks; and a routing pitch of a set of tracks is equal to an integral multiple of a grid pitch. Therefore, process 406B may determine a set of grids with a grid pitch in a direction perpendicular to a routing direction for a set of routing tracks with the routing direction and a routing pitch.

In some embodiments, process 408 may optionally include the process 408B of performing a cost-benefit analysis to determine the first grid pitch for the first set of grids. In some embodiments, process 408B may perform a cost-benefit analysis to determine the first grid pitch for the first set of grids based at least in part on the first routing pitch. For example, process 408B may perform a cost-benefit analysis to determine how fine or how coarse the grid pitch is, and how the grid pitch is affecting one or more subsequent processes or operations (e.g., design rule checking (DRC) or searches) performed on the physical design with the first set of grids. In this example, the first set of grids with finer pitch provides better resolution but may result in larger data structure(s) for storing the design because of the increasing number of points at the grid lines due to the finer grids. Depending on the algorithms used for, for example, a DRC process, the cost for searching or checking a particular design with such finer grids may increase. Therefore, in some embodiments, process 408B determines the first grid pitch for the first set of grids based at least in part upon the results of the cost-benefit analysis (or analyses).

In some embodiments, process 408 may include the process 410B of determining the first grid pitch or the first grid offset for the first set of grids. In some embodiments, process 410B determines the first grid pitch or the first grid offsets for the first set of grids based at least in part on the routing grid pitch(es) of the one or more adjacent second layers. In addition or in the alternative, process 410B determines the first grid pitch or the first grid offsets for the first set of grids based at least in part on some cost-benefit analysis results. In some embodiments where a single layer exhibits multiple routing pitches, process 410B may determine multiple grid pitches and multiple grid offsets for the first set of grids accordingly. In some embodiments, process 410B may identify the first grid pitch based at least in part upon, for example but not limited to, simulations, heuristics, historical design data of similar designs, etc.

Figure 5A:
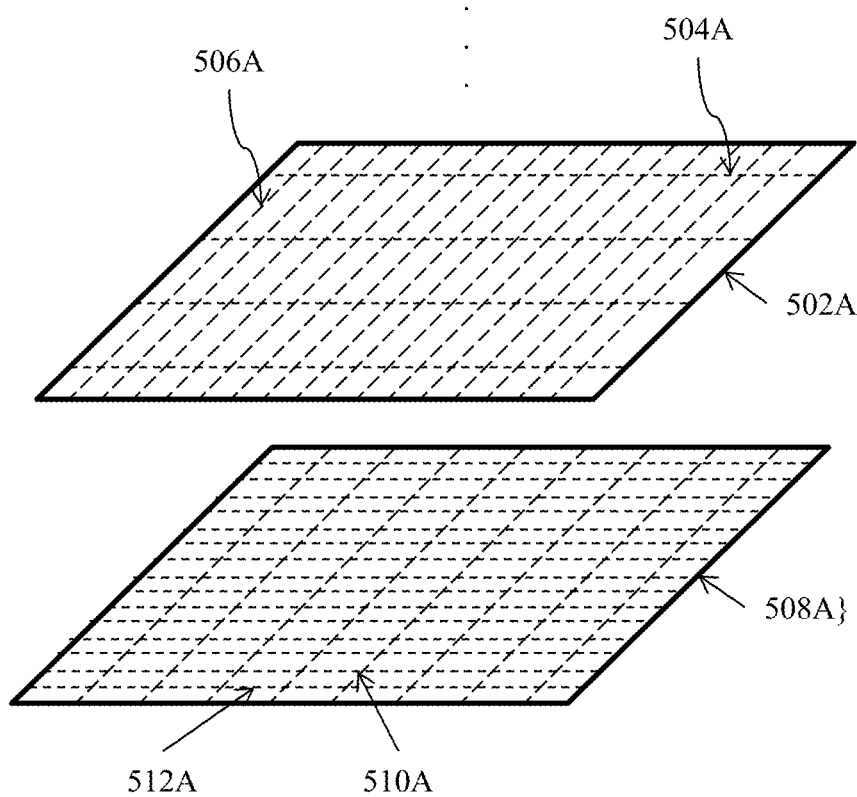
FIG. 5A illustrates an exemplary of routing tracks and a set of multi-exposure grids for each metal layer in some embodiments.

FIG. 5A illustrates an exemplary of routing tracks and a set of multi-exposure grids for each metal layer in some embodiments. More specifically, FIG. 5A illustrates two routing layers—metal 1 (M1) 508A and metal 2 (M2) 502A. Metal 1 routing layer 508A may have a set of routing tracks 510A in a first direction having uniform or non-uniform routing pitches. Metal 1 routing layer 508A may also have a set of grids 512A in a second direction. In some embodiments where the Manhattan routing grids are used, the second direction is perpendicular to the first direction. Metal 2 routing layer 502A includes a set of routing tracks 504A with uniform or non-uniform routing pitches in the second direction and a set of grids 506A in the first direction. In these embodiments illustrated in FIG. 5A, the routing tracks and the MP grids are always in two different routing directions on each layer.

Figure 5B:
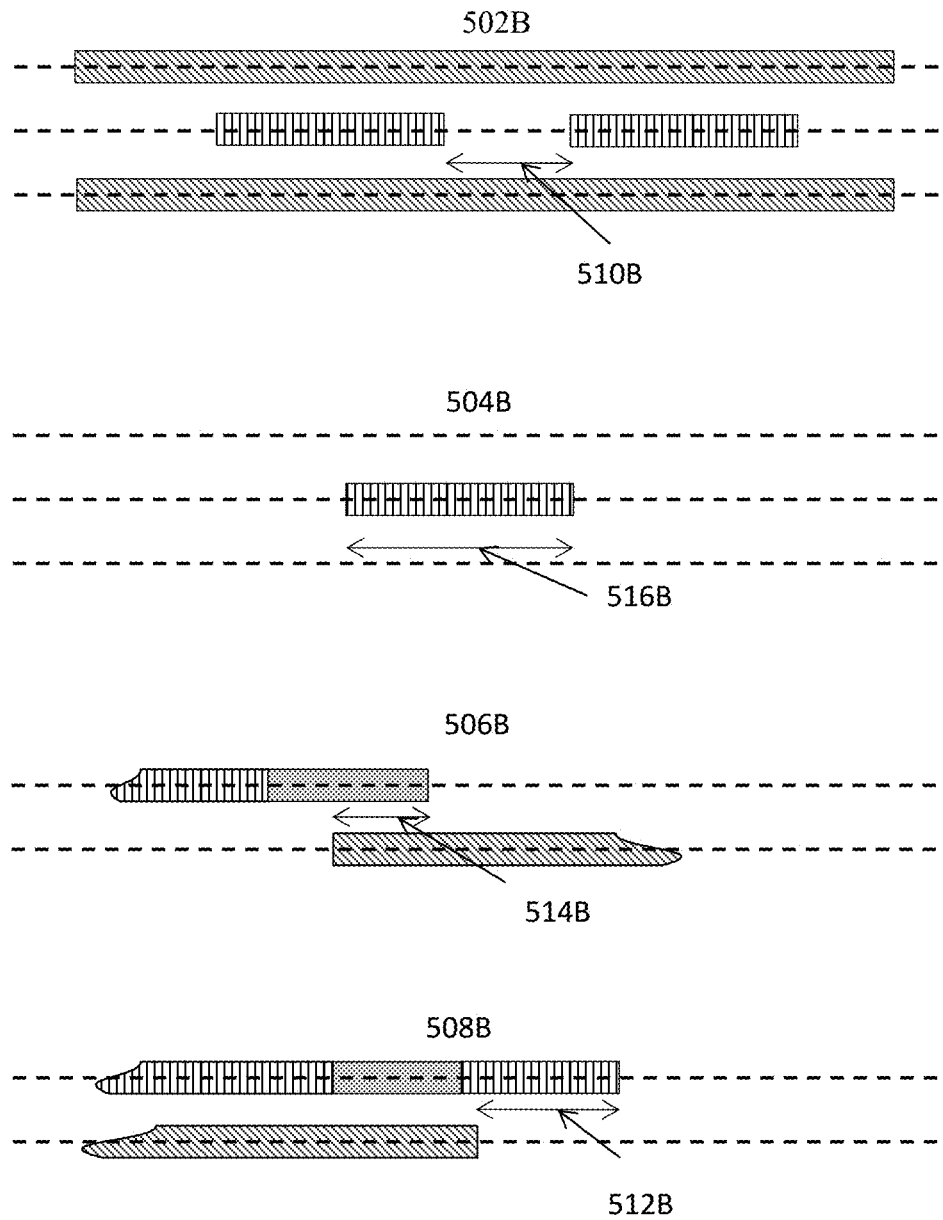
FIG. 5B illustrates some exemplary multi-exposure trim mask rules in some embodiments.

FIG. 5B illustrates some exemplary multi-exposure trim mask rules in some embodiments. 502B illustrates the trim mask minimum width rule where 510B represents the minimum spacing between two interconnects. 504B illustrates the minimum area rule that requires a minimum length 516B for a shape. For interconnects in advanced technology nodes, the area of one of the shapes is proportion to its length. Therefore, the minimum area rule imposes a minimum length for each interconnect. 506B represents the trim mask spacing rule that requires two neighboring interconnects running in opposite direction to have a minimum overlapping distance 514B. Rule 508B represents the trim mask minimum step rule that requires two neighboring interconnects running in the same direction to have a step having a minimum step of 512B.

Figure 5C:
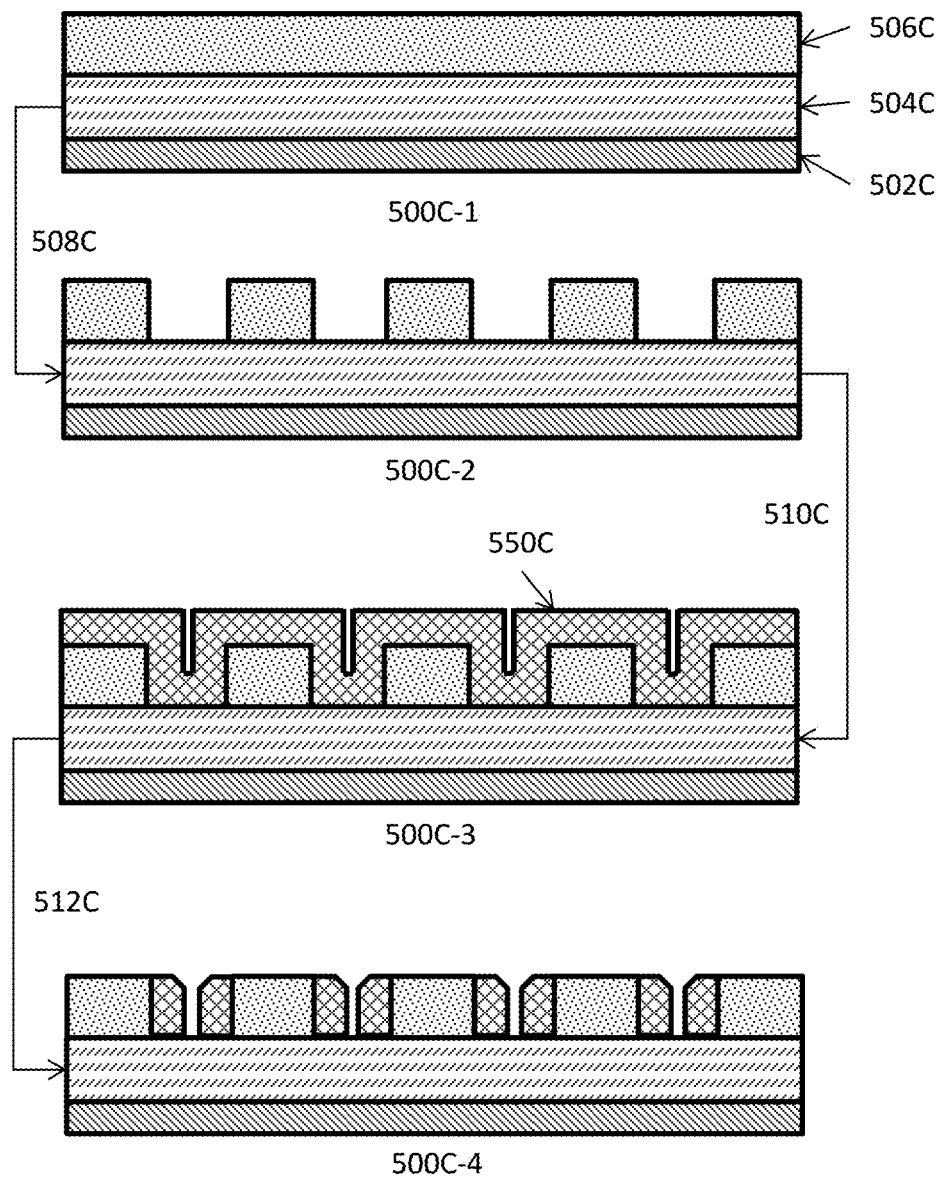
FIG. 5C illustrates a simplified schematic representation of a self-aligned image transfer process in some embodiments.
Figure 5C:
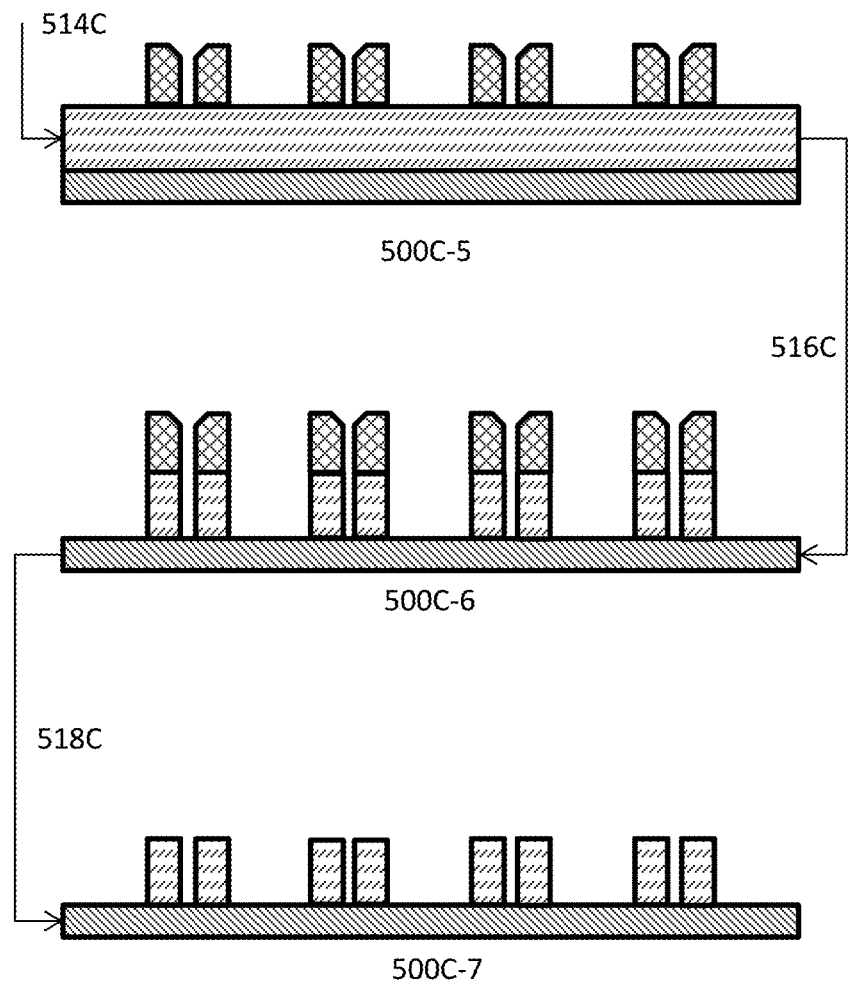

FIG. 5C illustrates a simplified schematic representation of a self-aligned image transfer process in some embodiments. The schematic representation of the process starts with a stack of three layers 500C-1-substrate 502C followed by the deposited hard mask etch layer in, for example, poly-silicon 504C with the photo resist 506C on top. 508C represents a core lithography process to form 500C-2 in which the photo resist 506C is exposed to form the particular pattern as shown in 500C-2. The stack 500C-2 then undergoes a spacer deposition process 510C to form the spacer 550C on top of the patterned photo resist 506C in 500C-2. A spacer comprises a film layer formed on the sidewall of a pre-patterned feature (e.g., the photo resist feature in 500C-2 formed by the core lithography exposure). The SADP process then uses the trim mask for trimming the spacer. A resulting stack is then shown in 500C-3 which is subsequently processed by an etching process 512C to form the stack 500C-4 where the spacer 550C above the photo resist 506C is etched away. Because there are two spacers for each feature in the photo resist, the density of features may thus be doubled, or the pitch may be halved with the use of spacers. The stack 500C-4 then undergoes the spacer sidewall formation process 514C to form the stack 500C-5 where the photo resist 506C in 500C-4 is removed. Stack 500C-5 is then processed with another etching step to pattern the hard mask etch layer 504C to form the patterned stack 500C-6 that is further processed by a positive tone spacer removal etching process to form the final pattern of the hard mask illustrated in stack 500C-7.

Figure 6A:
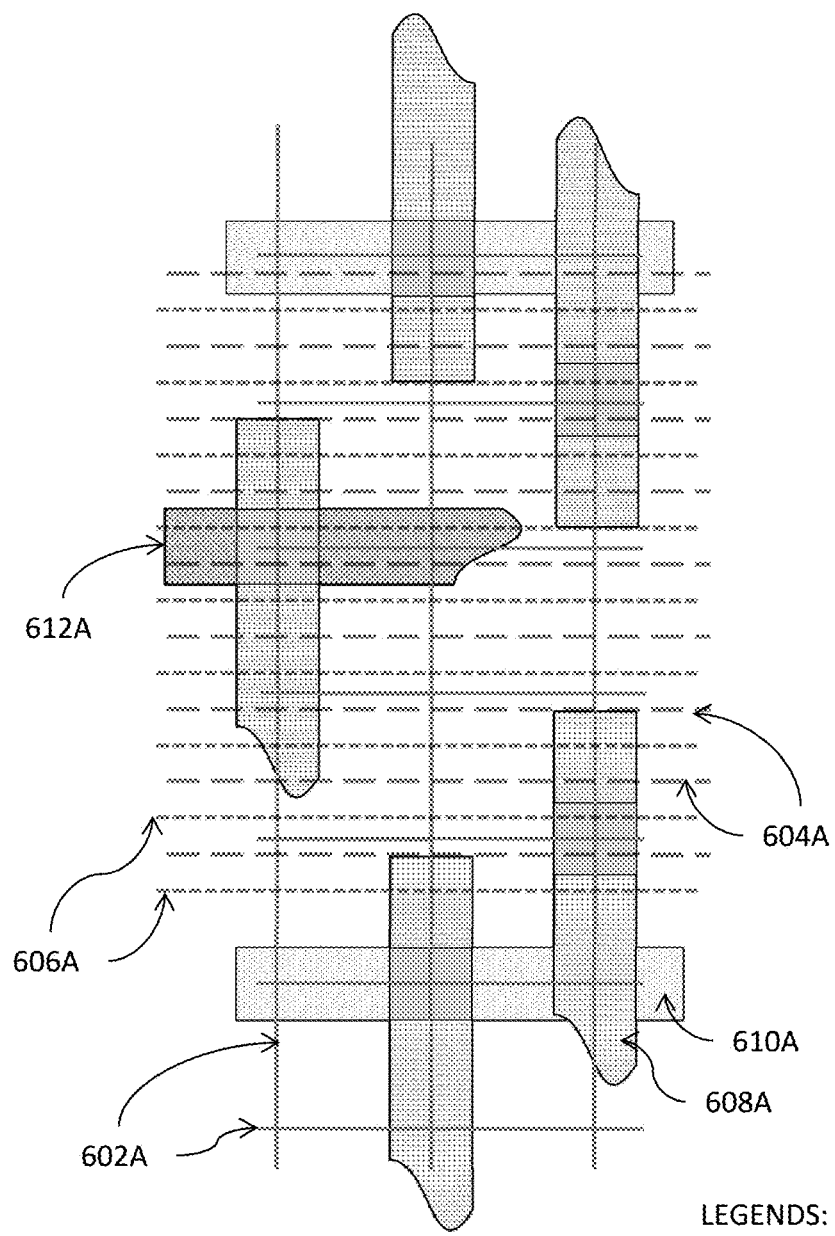
FIGS. 6A-C illustrate an exemplary implementation of the process illustrated in FIG. 4 in some embodiments.
Figure 6B:
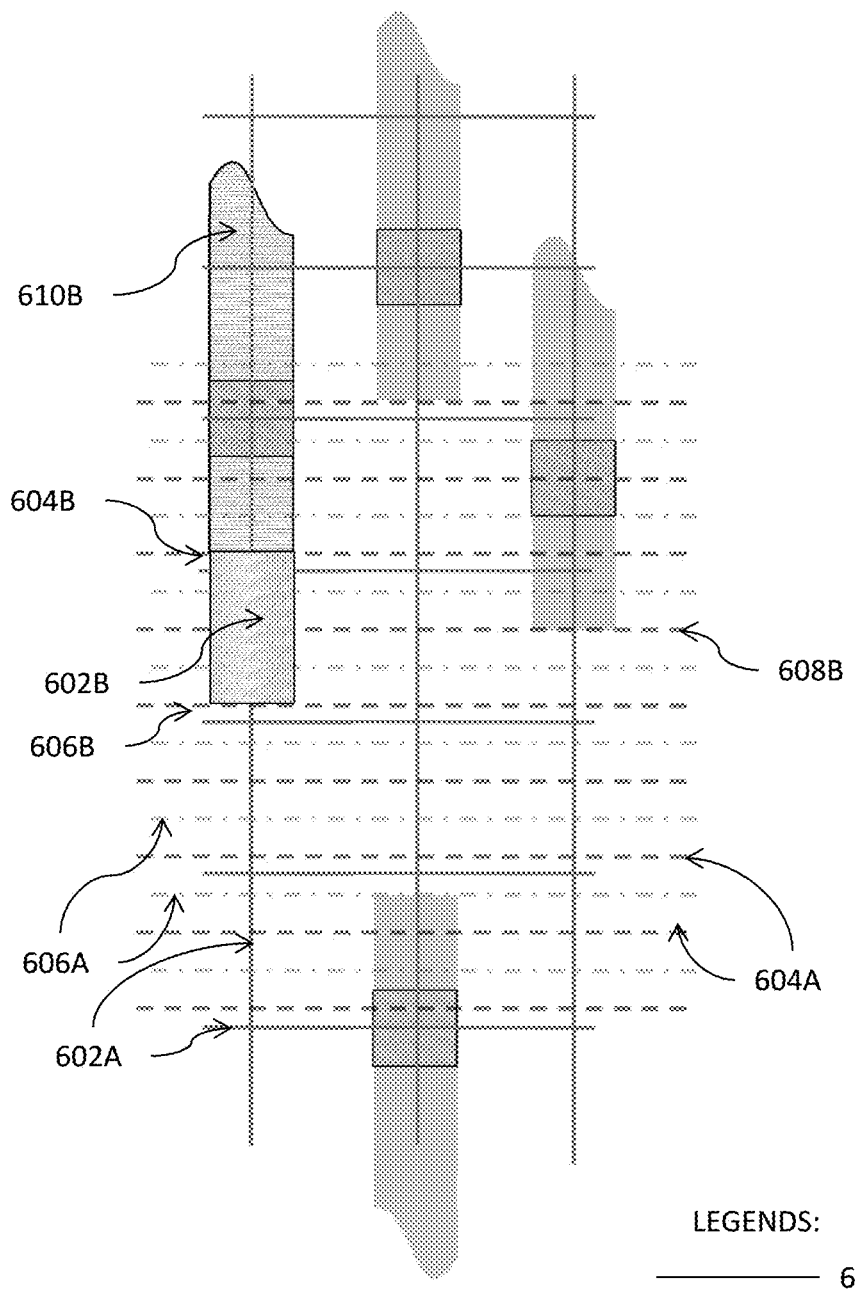
Figure 6C:
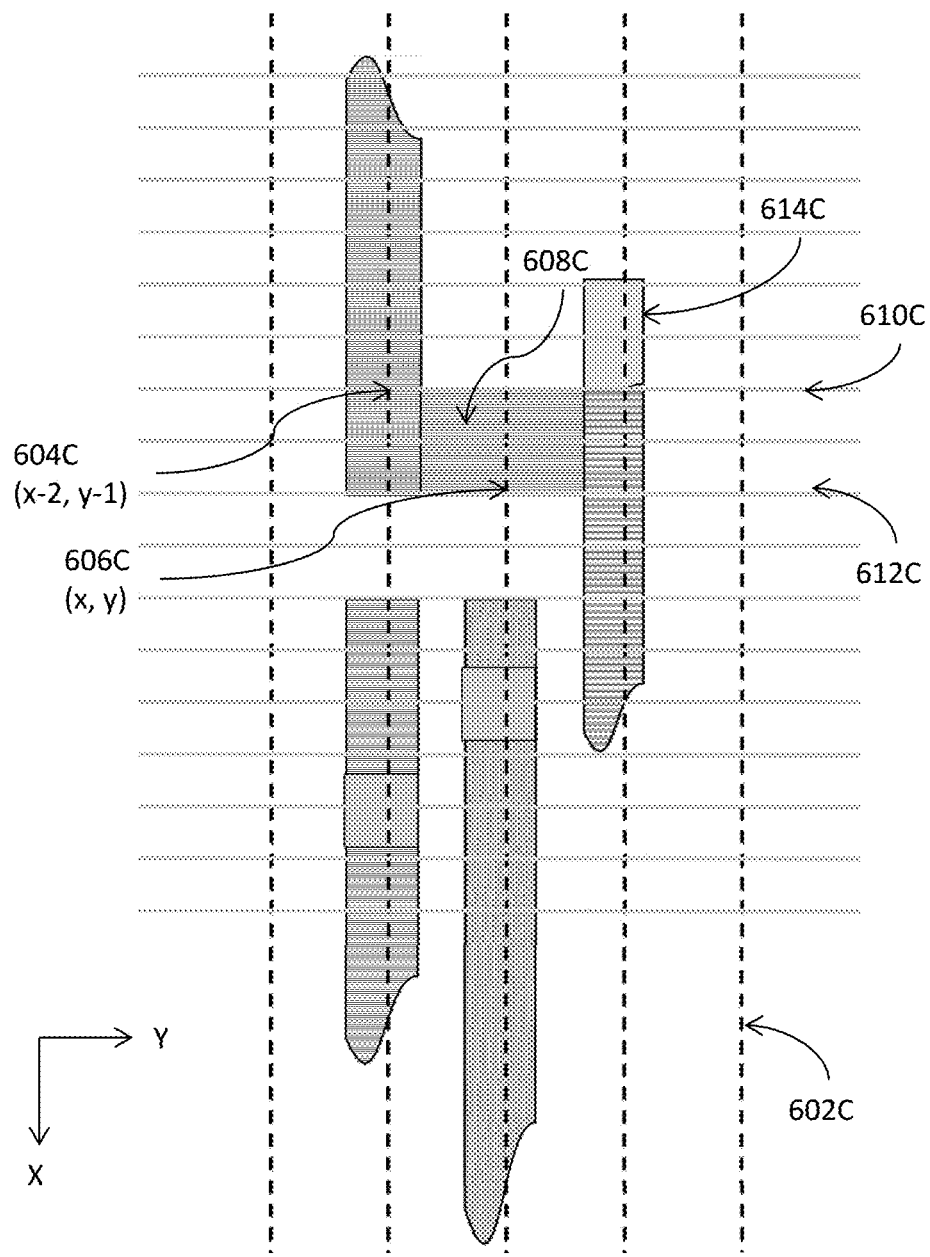

FIGS. 6A-C illustrate an exemplary implementation of the process illustrated in FIG. 4 in some embodiments. More specifically, FIG. 6A illustrates an working example of the processes described herein. In FIG. 6A, 602A denotes the routing tracks in the first direction and the second direction. 604A denotes the first set of grids (high grids) to which line ends running in the upward direction will be extended, and 606A denotes the second set of grids (low grids) to which line ends running in the downward direction will be extended. In this example, the direction of the low grids and the high grids is perpendicular to the routing direction of the routing tracks 602A. Moreover, 612A denotes the shapes (e.g., interconnects, pins, terminals, pads, etc.) in the third routing layer (M3); 608A denotes shapes in the second routing layer (M2); and 610A denotes the shapes (e.g., interconnects) in the first routing layer (M1). The intersections between shapes of different routing layers represent vias. To further illustrate various processes and data described herein, it is further assumed that M1 has a routing pitch of 100-nm; M2 has a routing pitch of 100-nm; and M3 has a routing pitch of 150-nm. The minimum cut enclosure is assumed to be 40-nm, and the cut size is assumed to be 50-nm. Following the description of various embodiments described herein, the edge map for the second routing layer (M2) may be associated with or store the routing pitch of 100-nm, which corresponds to the routing pitch of M2. The processes may determine the grid pitch for M2 to be 50-nm because 50-nm represents a common divisor (the great common divisor in this example) of the routing pitch 100-nm of M1 and the routing pitch 150-nm of M3. In some embodiments, the grid pitch may also be, for example, 25-nm or any common divisor of the two routing pitches of the two adjacent layers of M2. The processes described herein may also determine the grid offset to be half of the cut size (because the center of a via cut is placed along a routing track) plus the via enclosure rule (40-nm). In this example, the grid offset may be determined to be (50/2+40) or 65-nm. Therefore, the high grids may be offset from the routing tracks by 65-nm in the upward direction, and the low grids may be offset from the routing tracks by −65-nm, where the minus sign in the offset of the low grids indicates the offset is in the opposite direction of the high grids offset direction. In the example illustrated in FIG. 6A, no enforced extension is needed because all high_line_ends and low_line_ends fall on some grids.

FIG. 6B illustrates enforced extension of the low_line_end of a shape 610B (e.g., an interconnect) from the original position 604B to 606B with the enforced extension 602B representing an additional length added to the original shape 610B. In this example, various processes do not extend 610B to the closest low grid 608B but to the next closest grid 606B. This may be due to a violation of one or more design rules if the shape 610B were to be extended to 608B.

FIG. 6C illustrates an example of using an edge map to represent wrong-way interconnects. More specifically, assuming the preferred routing direction is the X-direction as shown by the routing tracks 602C. The shape (e.g., interconnect) 608C thus represents a wrong-way interconnect because 608C is appears to be routed in the Y-direction. In this example, some embodiments may employ extra bits of low_con and high_con to represent the wrong-way interconnect 608C. Also, grids may also be set up in such a way that the enforced extension (between 610C and 612C) is minimized for the wrong-way interconnect 612C. As it can be seen in FIG. 6C, the coarser the grids are, the longer (in the X-direction) the wrong-way interconnect will be. Also, although wrong-way interconnect 608C appears to be routed in the Y-direction, various processes treat the wrong-way interconnect 608C as if it were a right-way interconnect and thus ensure that the line-ends of 608C are extended to the appropriate grids (610C and 612C) while using the low_con and high_con extra bits to indicate that 608C is a wrong-way interconnect. 604C denotes a through-wire at (x-2, y-1), and 606C denotes a line_end with both low_con and high_con at (x, y) to cover the span of the wrong-way interconnect. Moreover, 614C shows that right-way extension on wrong-way interconnect may also be accommodated by some embodiments.

System Architecture Overview

Figure 7:
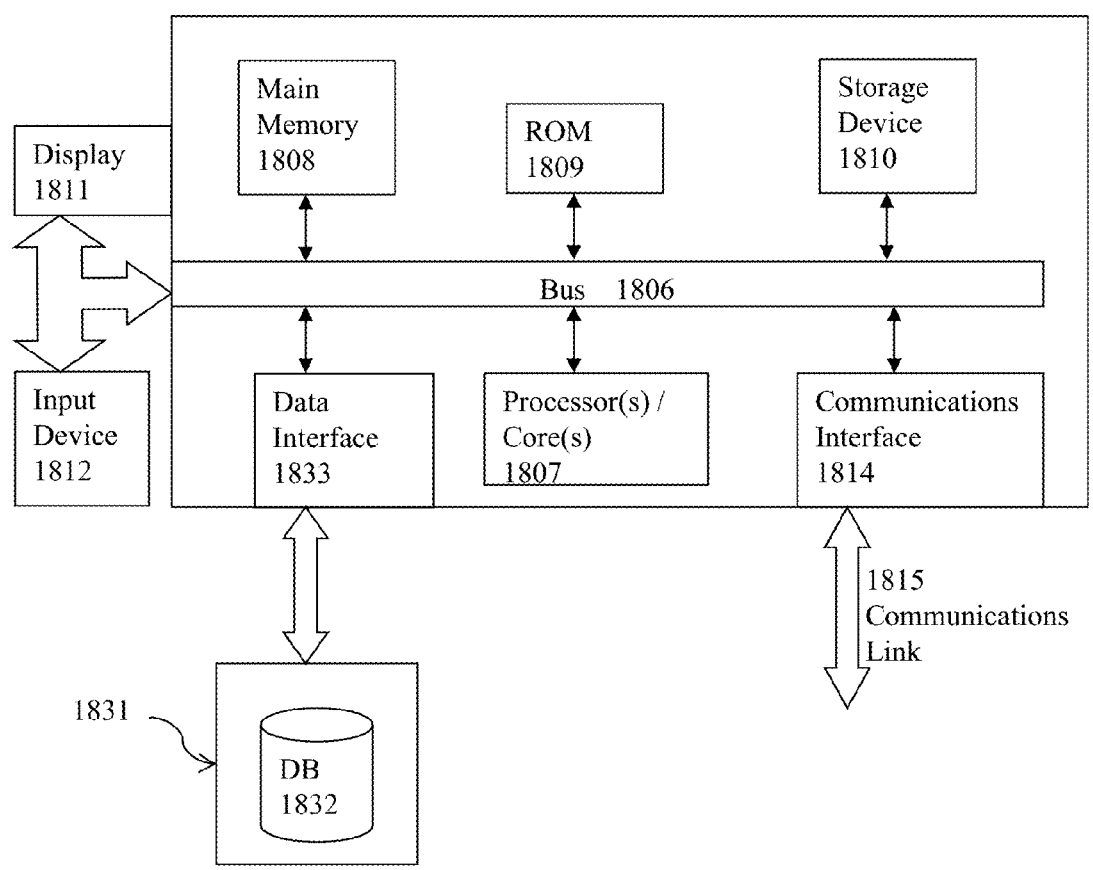
FIG. 7 illustrates a block diagram of an illustrative computing system 1400 suitable for implementing various embodiments described here.

FIG. 7 illustrates a block diagram of an illustrative computing system 1800 suitable for implementing various embodiment of the invention. For example, the exemplary computing system 1800 may be used to implement various processes as described in the preceding paragraphs and the figures such as various processes or modules of determining whether the first post is of interest, various analysis processes or modules, various other determining processes or modules, various processes or modules for performing various actions, etc. as described in the remainder of the Application. Computer system 1800 includes a bus 1806 or other communication mechanism for communicating information, which interconnects subsystems and devices, such as processor 1807, system memory 1808 (e.g., RAM), static storage device 1809 (e.g., ROM), disk drive 1810 (e.g., magnetic or optical), communication interface 1814 (e.g., modem or Ethernet card), display 1811 (e.g., CRT or LCD), input device 1812 (e.g., keyboard), and cursor control (not shown).

According to one embodiment of the invention, computer system 1800 performs specific operations by one or more processors or processor cores 1807 executing one or more sequences of one or more instructions contained in system memory 1808. Such instructions may be read into system memory 1808 from another computer readable/usable storage medium, such as static storage device 1809 or disk drive 1810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention. In the single embodiment or in some embodiments, the one or more processors or processor cores 1807 may be used to perform various actions such as various actions, processes, or modules involving determining, analyzing, performing actions, etc. In some embodiments, at least one of the one or more processors or processor cores 1807 has the multithreading capability.

In one embodiment, the term "logic" shall mean any combination of software or hardware that is used to implement all or part of the invention. In the single embodiment or in some embodiments, the one or more processors or processor cores 1807 may be used to perform various acts such as various acts involving determining, analyzing, performing actions, etc. In some embodiments, at least one of the one or more processors or processor cores 1807 has the multithreading capability to execute a plurality of threads to perform various tasks as described in the preceding sections.

Various actions as described in the preceding paragraphs may be performed by using one or more processors, one or more processor cores, or combination thereof 1807. For example, various processes or modules involving the determining action, various analysis processes or modules, etc. may be performed by one or more processors, one or more processor cores, or combination thereof.

The term "computer readable storage medium" or "computer usable storage medium" as used herein refers to any non-transitory medium that participates in providing instructions to processor 1807 for execution. Such a medium may take many forms, including but not limited to, non-volatile media and volatile media. Non-volatile media includes, for example, optical or magnetic disks, such as disk drive 1810. Volatile media includes dynamic memory, such as system memory 1808.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), a magnetic tape, any other magnetic or a magneto-optical medium, CD-ROM, any other optical medium, punch cards, paper tape, any other physical medium with patterns of holes, RAM, PROM, EPROM, FLASH-EPROM, any other memory chip or cartridge, or any other medium from which a computer can read. For example, the various forms of computer readable storage media may be used by the methods or the systems to store either temporarily or permanently information or data such as the one or more master regions, one or more master output layers, one or more global scratch layers, various transforms and inverse transforms, shapes, etc.

In an embodiment of the invention, execution of the sequences of instructions to practice the invention is performed by a single computer system 1800. According to other embodiments of the invention, two or more computer systems 1800 coupled by communication link 1815 (e.g., LAN, PTSN, or wireless network) may perform the sequence of instructions required to practice the invention in coordination with one another.

Computer system 1800 may transmit and receive messages, data, and instructions, including program, i.e., application code, through communication link 1815 and communication interface 1814. Received program code may be executed by processor 1807 as it is received, and/or stored in disk drive 1810, or other non-volatile storage for later execution. In an embodiment, the computer system 1800 operates in conjunction with a data storage system 1831, e.g., a data storage system 1831 that contains a database 1832 that is readily accessible by the computer system 1800. The computer system 1800 communicates with the data storage system 1831 through a data interface 1836. A data interface 1836, which is coupled to the bus 1806, transmits and receives electrical, electromagnetic or optical signals that include data streams representing various types of signal information, e.g., instructions, messages and data. In embodiments of the invention, the functions of the data interface 1836 may be performed by the communication interface 1814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for implementing correct-by-construction physical designs with multiple-patterning-awareness, comprising:
   at least one processor performing a process, the process comprising:
   identifying a first set of routing tracks for a first layer in the electronic design;
   selecting a first set of grids for the first layer based at least on the first set of routing tracks and one or more adjacent layers of the first layer; and
   implementing a first shape in a physical design for the first layer by at least extending a first shape end of the first shape to a first grid of the first set of grids or by contracting the first shape end of the first shape to a second grid of the first set of grids.

2. The computer implemented method of claim 1, the process further comprising:
   reserving additional space in a direction of terminating the first shape end of the first shape in the physical design.

3. The computer implemented method of claim 1, the process further comprising:
   identifying a second set of grids for the first layer based at least in part upon the first set of grids, wherein the second set of grids are parallel to the first set of grids.

4. The computer implemented method of claim 3, the process further comprising:
   identifying a second shape end of the first shape or another shape end of another shape in the first layer; and
   determining whether the second shape end or the another shape end is a low-end or a high-end.

5. The computer implemented method of claim 4, the process further comprising:
   determining a second grid from the first set of grids or the second set of grids based at least in part on determination of whether the second shape end or the another shape end is a low-end or a high-end; and
   terminating the second shape end of the first shape or the another shape end of the another shape at the second grid.

6. The computer implemented method of claim 3, in which the process further comprises:
   identifying an existing shape end of an existing shape in the first layer; and
   performing enforced extension or contraction on the existing shape end.

7. The computer implemented method of claim 6, in which the process further comprises:
   determining whether the second shape end or the another shape end is a low-end or a high-end;
   determining a third grid from the first set of grids or the second set of grids based at least in part on determination of whether the existing shape end is a low-end or a high-end for the existing shape; and terminating the existing shape end of the existing shape at the third grid.

8. The computer implemented method of claim 1, in which the first layer comprises multiple sets of routing tracks having multiple, different routing pitches.

9. The computer implemented method of claim 1, in which the process further comprises:
   identifying data of the first shape end;
   identifying or generating a data structure for storing the physical design for the first layer of the electronic design; and
   populating the data structure with the data of the first shape end without including other geometric data for the first shape in the data structure.

10. The computer implemented method of claim 1, in which the act of identifying the first set of grids for the first layer comprises:
    identifying a first set of rules associated with the first layer;
    identifying a second set of rules for the first layer based at least in part upon one or more second layers of the electronic design;
    identifying or determining grid spacing and grid pitch for the first set of grids based at least in part upon the second set of rules; and
    identifying or determining the first set of grids by using at least the grid spacing and the grid pitch.

11. The computer implemented method of claim 1, in which the physical design is correct by construction as the physical design is being implemented without having to be checked against one or more design rules.

12. The computer implemented method of claim 11, in which one or more design rules comprise a plurality of trim mask rules.

13. The computer implemented method of claim 1, in which the process further comprising:
    identifying one or more candidate grids for terminating the first shape end in addition to the first grid; and
    determining whether the first shape end, which has been terminated at the first grid, satisfies one or more rules.

14. The computer implemented method of claim 13, in which the process further comprising:
    terminating the first shape end of the first shape at a candidate grid of the one or more candidate grids, rather than at the first grid, wherein the first shape end, which has been terminated at the first grid, is determined not to satisfy the one or more rules.

15. The computer implemented method of claim 13, in which the one or more candidate grids are identified based at least in part a cost or performance metric for the electronic design.

16. An article of manufacture comprising a non-transitory computer readable storage medium storing thereupon a sequence of instructions which, when executed by at least one processor or at least one processor core, causes the at least one processor or the at least one processor core to perform a method for implementing correct-by-construction physical designs with multiple-patterning-awareness, the method comprising:
    at least one processor performing a process, the process comprising:
    identifying a first set of routing tracks for a first layer in the electronic design;
    selecting a first set of grids for the first layer based at least on the first set of routing tracks and one or more adjacent layers of the first layer; and
    implementing a first shape in a physical design for the first layer by at least extending a first shape end of the first shape to a first grid of the first set of grids or by contracting the first shape end of the first shape to a second grid of the first set of grids.

17. The article of manufacture of claim 16, the process further comprising:
    reserving additional space in a direction of terminating the first shape end of the first shape in the physical design.

18. The article of manufacture of claim 16, the process further comprising:
    identifying a second set of grids for the first layer based at least in part upon the first set of grids, wherein the second set of grids are parallel to the first set of grids;
    identifying a second shape end of the first shape or another shape end of another shape in the first layer; and
    determining whether the second shape end or the another shape end is a low-end or a high-end.

19. The article of manufacture of claim 18, the process further comprising:
    determining a second grid from the first set of grids or the second set of grids based at least in part on determination of whether the second shape end or the another shape end is a low-end or a high-end; and
    terminating the second shape end of the first shape or the another shape end of the another shape at the second grid.

20. The article of manufacture of claim 18, in which the process further comprises:
    identifying an existing shape end of an existing shape in the first layer;
    performing enforced extension or contraction on the existing shape end;
    determining whether the second shape end or the another shape end is a low-end or a high-end;
    determining a third grid from the first set of grids or the second set of grids based at least in part on determination of whether the existing shape end is a low-end or a high-end for the existing shape; and
    terminating the existing shape end of the existing shape at the third grid.

21. The article of manufacture of claim 16, in which the process further comprises:
    identifying data of the first shape end;
    identifying or generating a data structure for storing the physical design for the first layer of the electronic design; and
    populating the data structure with the data of the first shape end without including other geometric data for the first shape in the data structure.

22. The article of manufacture of claim 16, in which the act of identifying the first set of grids for the first layer comprises:
    identifying a first set of rules associated with the first layer;
    identifying a second set of rules for the first layer based at least in part upon one or more second layers of the electronic design;
    identifying or determining grid spacing and grid pitch for the first set of grids based at least in part upon the second set of rules; and
    identifying or determining the first set of grids by using at least the grid spacing and the grid pitch.

23. The article of manufacture of claim 16, in which the process further comprising:
    identifying one or more candidate grids for terminating the first shape end in addition to the first grid;
    determining whether the first shape end, which has been terminated at the first grid, satisfies one or more rules; and terminating the first shape end of the first shape at a candidate grid of the one or more candidate grids, rather than at the first grid, wherein the first shape end, which has been terminated at the first grid, is determined not to satisfy the one or more rules.

24. A system for implementing multiple-patterning-aware correct-by-construction layout processing for an electronic design, comprising:
a computing system that comprises at least one processor having at least one core executing one or more threads of execution;
a non-transitory computer readable storage medium storing thereupon program code having a sequence of instructions which, when executed by the at least one processor, causes the at least one processor to identify a first set of routing tracks for a first layer in the electronic design, select a first set of grids for the first layer based at least on the first set of routing tracks and one or more adjacent layers of the first layer, and implement a first shape in a physical design for the first layer by at least extending a first shape end of the first shape to a first grid of the first set of grids or by contracting the first shape end of the first shape to a second grid of the first set of grids.

25. The system of claim 24, wherein the at least one processor further executes the sequence of instructions to reserve additional space in a direction of terminating the first shape end of the first shape in the physical design.

26. The system of claim 24, wherein the at least one processor further executes the sequence of instructions to identify a second set of grids for the first layer based at least in part upon the first set of grids, wherein the second set of grids are parallel to the first set of grids, to identify a second shape end of the first shape or another shape end of another shape in the first layer, and to determine whether the second shape end or the another shape end is a low-end or a high-end.

27. The system of claim 26, wherein the at least one processor further executes the sequence of instructions to determine a second grid from the first set of grids or the second set of grids based at least in part on determination of whether the second shape end or the another shape end is a low-end or a high-end, and to terminate the second shape end of the first shape or the another shape end of the another shape at the second grid.

28. The system of claim 26, wherein the at least one processor further executes the sequence of instructions to identify an existing shape end of an existing shape in the first layer, to perform enforced extension or contraction on the existing shape end, to determine whether the second shape end or the another shape end is a low-end or a high-end, to determine a third grid from the first set of grids or the second set of grids based at least in part on determination of whether the existing shape end is a low-end or a high-end for the existing shape, and to terminate the existing shape end of the existing shape at the third grid.

29. The system of claim 24, wherein the at least one processor further executes the sequence of instructions to identify data of the first shape end, to identify or generate a data structure for storing the physical design for the first layer of the electronic design, and to populate the data structure with the data of the first shape end without including other geometric data for the first shape in the data structure.

30. The system of claim 24, wherein the at least one processor that executes the sequence of instructions to identify the first set of grids for the first layer further executes the sequence of instructions to identify a first set of rules associated with the first layer, to identify a second set of rules for the first layer based at least in part upon one or more second layers of the electronic design, to identify or determine grid spacing and grid pitch for the first set of grids based at least in part upon the second set of rules, and to identify or determine the first set of grids by using at least the grid spacing and the grid pitch.

31. The system of claim 24, wherein the at least one processor further executes the sequence of instructions to identify one or more candidate grids for terminating the first shape end in addition to the first grid, to determine whether the first shape end, which has been terminated at the first grid, satisfies one or more rules, and to terminate the first shape end of the first shape at a candidate grid of the one or more candidate grids, rather than at the first grid, wherein the first shape end, which has been terminated at the first grid, is determined not to satisfy the one or more rules.

* * * * *